United States Patent
Ogawa et al.

(10) Patent No.: US 6,188,119 B1
(45) Date of Patent: Feb. 13, 2001

(54) SEMICONDUCTOR DEVICE HAVING BARRIER METAL LAYER BETWEEN A SILICON ELECTRODE AND METAL ELECTRODE AND MANUFACTURING METHOD FOR SAME

(75) Inventors: Chihiro Ogawa; Yasuaki Hokari, both of Tokyo (JP)

(73) Assignee: NEC Corporation, Tokyo (JP)

( * ) Notice: Under 35 U.S.C. 154(b), the term of this patent shall be extended for 0 days.

(21) Appl. No.: 09/018,462

(22) Filed: Feb. 4, 1998

(30) Foreign Application Priority Data

Feb. 10, 1997  (JP) .................................................. 9-026765

(51) Int. Cl.⁷ ...................... H01L 31/0232; H01L 29/76; H01L 23/48; H01L 23/52; H01L 29/40
(52) U.S. Cl. ......................... 257/435; 257/413; 257/751; 257/755; 257/758
(58) Field of Search .................................... 257/382, 412, 257/413, 751, 755, 758, 435, 443

(56) References Cited

U.S. PATENT DOCUMENTS 5,600,165 * 2/1997 Tsukamoto et al. .................. 257/412

FOREIGN PATENT DOCUMENTS

| | | | |
|---|---|---|---|
| 56-162871 | * 12/1981 | (JP) | 257/412 |
| 63-133672 | * 6/1988 | (JP) | 257/413 |
| 63-283161 | 11/1988 | (JP) | 257/751 |
| 64-64356 | 3/1989 | (JP) | 257/435 |
| 2-36539 | * 2/1990 | (JP) | 257/413 |
| 3-174771 | 7/1991 | (JP) | 257/435 |
| 3-184375 | 8/1991 | (JP) | 257/435 |
| 3-188672 | 8/1991 | (JP) | 257/435 |
| 3-222474 | * 10/1991 | (JP) | 257/443 |
| 4-245474 | 9/1992 | (JP) | 257/435 |
| 7-30104 | * 1/1995 | (JP) | 257/413 |
| 7-211883 | 8/1995 | (JP) | 257/435 |
| 8-222721 | 8/1996 | (JP) | 257/435 |

OTHER PUBLICATIONS

K. Orihara et al., IEEE IEDM (International Electronic Devices Meeting), "New Shunt Wiring Technologies for High Performance HDTV CCD Image Sensors", 1992, pp. 105–108.

* cited by examiner

Primary Examiner—Steven H. Loke
(74) Attorney, Agent, or Firm—Young & Thompson

(57) ABSTRACT

A semiconductor device is disclosed that has a barrier metal layer between a silicon electrode and a metal electrode. For providing contacts on a charge transfer electrode made up of polysilicon, between the electrode and a shield film, which is a conductive film, without causing changes in channel potential or threshold voltage or influencing the charge transfer rate, a barrier metal layer composed of a metal silicide is provided between the shield film and the charge transfer electrode.

9 Claims, 22 Drawing Sheets

SEMICONDUCTOR DEVICE HAVING BARRIER METAL LAYER BETWEEN A SILICON ELECTRODE AND METAL ELECTRODE AND MANUFACTURING METHOD FOR SAME

BACKGROUND OF THE INVENTION

1. Field of the Invention

The present invention relates to a semiconductor device and its method of manufacture, and in particular, relates to a semiconductor device in which there is contact between a polysilicon electrode and metal electrode in a gate region, and a manufacturing method for such a semiconductor device.

2. Description of the Related Art

FIG. 1 is a plan view of a MOS transistor of the prior art. The prior-art MOS transistor is formed from gate electrode 97 composed of polysilicon, drain region 94, and source region 95. Gate electrode 97, drain region 94 and source region 95 are each connected to metal wiring 91 by means of contacts 99. Contacts 99 are formed on element isolation region 93 formed from a thick silicon oxide film that covers the field region. However, gate electrode 97 of the transistor is fabricated at close to the limits of accuracy of methods such as lithographic processing, and the formation of contacts 99 in the gate region is therefore difficult. Contacts 99 are therefore provided on the element isolation region 93 apart from the gate region.

However, in a semiconductor device in which an electrode formed from polysilicon is provided over a wide area, such as in a CCD (Charge Coupled Device) solid-state image-sensing device, a polysilicon electrode has a sheet resistance on the order of 20~50 Ω/□. This sheet resistance can be reduced by providing a metal electrode on the rear surface of the polysilicon electrode and by providing contacts for connection with the metal electrode directly over the polysilicon electrode.

FIG. 2 is a schematic sectional view of this type of prior-art solid-state image-sensing device. In this prior-art solid-state image-sensing device, charge transfer electrodes 108 and 110 are provided on diffusion region 100. Change to lower sheet resistance is then brought about by first connecting polysilicon wiring 101 with charge transfer electrode 108 or 110 by way of contact 101a, and connecting aluminum layer 103 with this polysilicon wiring 101 by way of contact 103a.

Here, a method of connecting aluminum layer 103 with charge transfer electrode 108 or 110 by means of contact 103a has also been considered, but such a method could not be employed because aluminum layer 103 tends to diffuse within polysilicon electrode and therefore deposits on the gate insulation film surface partially, thereby resulting in such problems as alteration of the silicon surface potential and lowering of the dielectric strength of the oxide film.

FIG. 3 is a schematic sectional view showing a prior-art solid-state image-sensing device for solving the above-described problems.

This solid-state image-sensing device of the prior art is described at pages 105~108 of the preliminary papers of the 1992 IEDM (International Electronic Devices Meeting).

This solid-state image-sensing device of the prior art employs tungsten layer 105 in a shield layer, this tungsten layer 105 being connected with charge transfer electrode 108 and charge transfer electrode 110 by way of contacts 105a. Tungsten layer 105 simultaneously serves as a shield layer and wiring.

Tungsten is not as prone as aluminum to diffuse into a polysilicon electrode, and as a result, when tungsten layer 105 is used as wiring, it can directly connect with charge transfer electrodes 108 and 110 by way of contact 105a.

This solid-state image-sensing device of the prior art enables a greater reduction of the sheet resistance than the solid-state image-sensing device of FIG. 2 by using tungsten layer 105 for wiring in place of an aluminum layer. This element also provides the effect of greatly reducing the series parasitic resistance of the power source of charge transfer electrodes 108 and 110. The preliminary papers of the IEDM mentioned hereinabove also include a description of a CCD image sensor that applies the solid-state image-sensing device of FIG. 3.

In the above-described semiconductor devices of the prior art, however, a conductive film of, for example, tungsten comes in direct contact with a silicon electrode composed of polysilicon or single-crystal silicon, and CCD solid-state image-sensing devices of this construction therefore entail problems such as the occurrence of changes in threshold value or channel potential as well as drops in the charge transfer efficiency.

SUMMARY OF THE INVENTION

The object of the present invention is to provide a semiconductor device that operates stably without changes in channel potential or threshold value voltage despite direct contact between a conductive film constituted by a metal film and a silicon electrode.

To achieve the above-described object, the semiconductor device of the present invention includes:

first insulation film formed on the semiconductor substrate;

a silicon electrode that is formed on the first insulation film and that is made up of polysilicon or single-crystal silicon;

a second insulation film that is formed to cover the silicon electrode and that has an opening over the silicon electrode;

a barrier metal layer that is formed on the surface of the silicon electrode exposed in the opening and that is made up of a metal silicide; and a conductive film formed on the opening and on the second insulation film.

The present invention is a device provided with a barrier metal layer made up of a metal silicide between a silicon electrode and a conductive film.

As a result of this construction, a semiconductor device can be obtained that has a stable characteristic wherein channel potential or threshold value voltage does not change despite contact with the conductive film over the silicon electrode.

In addition, the semiconductor device of the present invention may include a titanium nitride film and titanium film between the second insulation film and the conductive film.

As a result, not only can the contact between the conductive film and second insulation film be improved; but the titanium nitride film and titanium film can be used as an etching barrier when patterning the conductive film; damage to the second insulation film, which is the ground when etching, can be reduced; and micro-patterning of the conductive film can be easily accomplished.

In addition, the semiconductor device of the present invention may include a titanium film formed between the second insulation film and the conductive film.

As a result, not only can the contact between the conductive film and the second insulation film be improved; but the titanium film can be used as an etching barrier when patterning the conductive film; damage to the second insulation film, which is the ground when etching, can be reduced; and micro-patterning of the conductive film can be easily accomplished.

In addition, the semiconductor device of the present invention may include a barrier metal layer formed on the surface of the silicon layer formed on the silicon electrode.

As a result, the silicon electrode can be made a thin-film because there is no need to reserve space on the silicon electrode for forming a barrier metal layer, thereby enabling an improvement in evenness, an improvement in coverage of the conductive film, and a decrease in the occurrence of defects caused by etching residue.

According to an embodiment of this invention, the silicon layer or the barrier metal layer can be formed in a hemispherical form on the second insulation film.

As a result, a surface of superior evenness is obtained, whereby excellent coverage and patterning can be obtained when forming the conductive film, and in addition, because the thickness of the silicon layer can be freely set even in cases in which the second insulation film is thin, positions at the edges of the conductive film can be lowered, leakage of light to the charge transfer region can be reduced in cases of application to a solid-state image-sensing device, and smear can be decreased.

The semiconductor device of the present invention may also include a barrier metal layer that is formed using a metal silicide that is formed as a silicide in advance.

As a result, fabrication processes can be simplified because processes are not required that would cause polysilicon to react with metal due to a heat treatment.

In addition, according to an embodiment of the present invention, the conductive film may be a single-layer or multiple-layer metal film.

Further, according to an embodiment of the present invention, the conductive film may be formed from a single layer or multiple layers of a material having conductivity.

According to another embodiment of the present invention, the conductive film may be tungsten, aluminum, aluminum alloy, or tungsten alloy.

The above and other objects, features, and advantages of the present invention will become apparent from the following description with references to the accompanying drawings which illustrate examples of the present invention.

DETAILED DESCRIPTION OF THE PREFERRED EMBODIMENTS

First Embodiment

Figure 1:
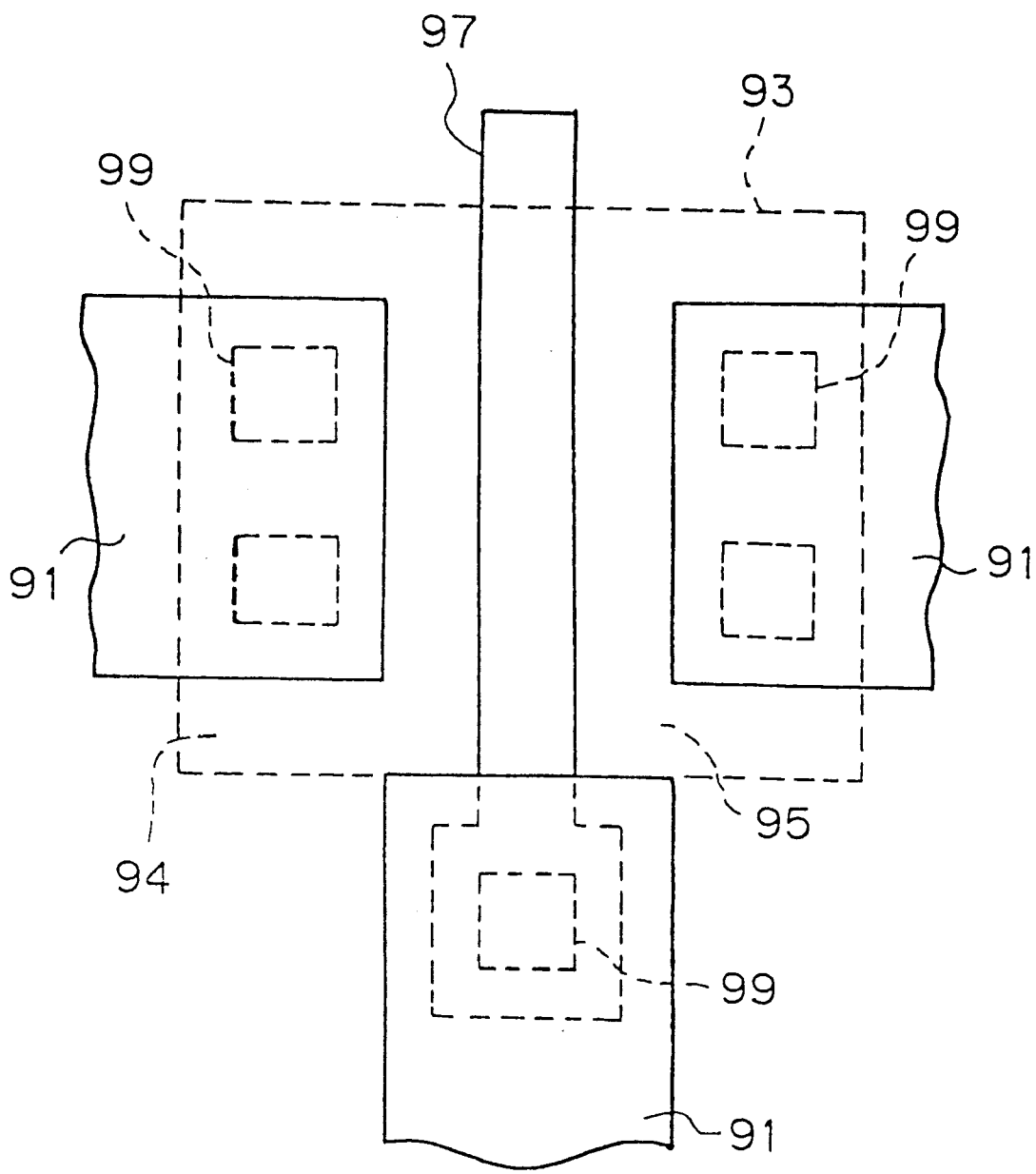
FIG. 1 is a plan view of a MOS transistor of the prior art.
Figure 2:
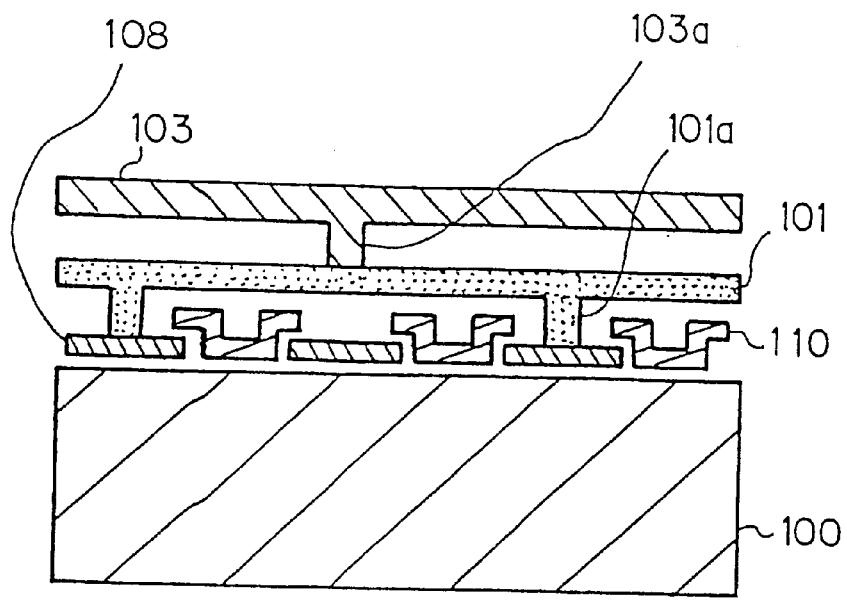
FIG. 2 is a sectional view of a solid-state image-sensing device of the prior art.
Figure 3:
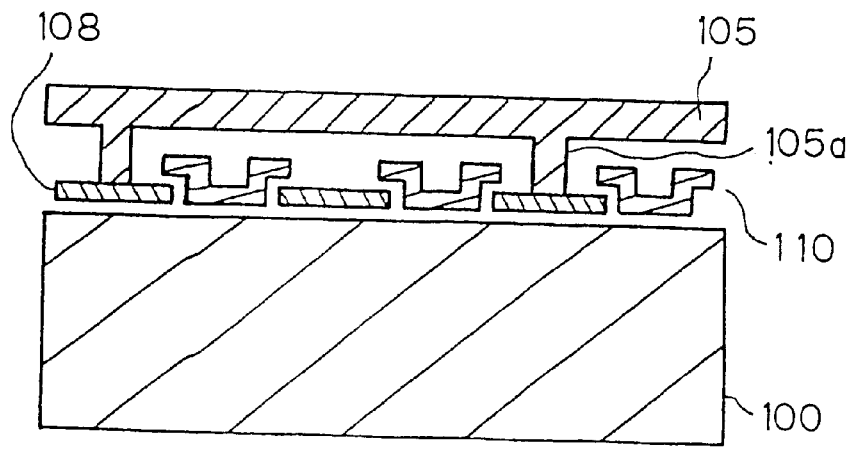
FIG. 3 is a sectional view of a solid-state image-sensing device of the prior art.
Figure 4:
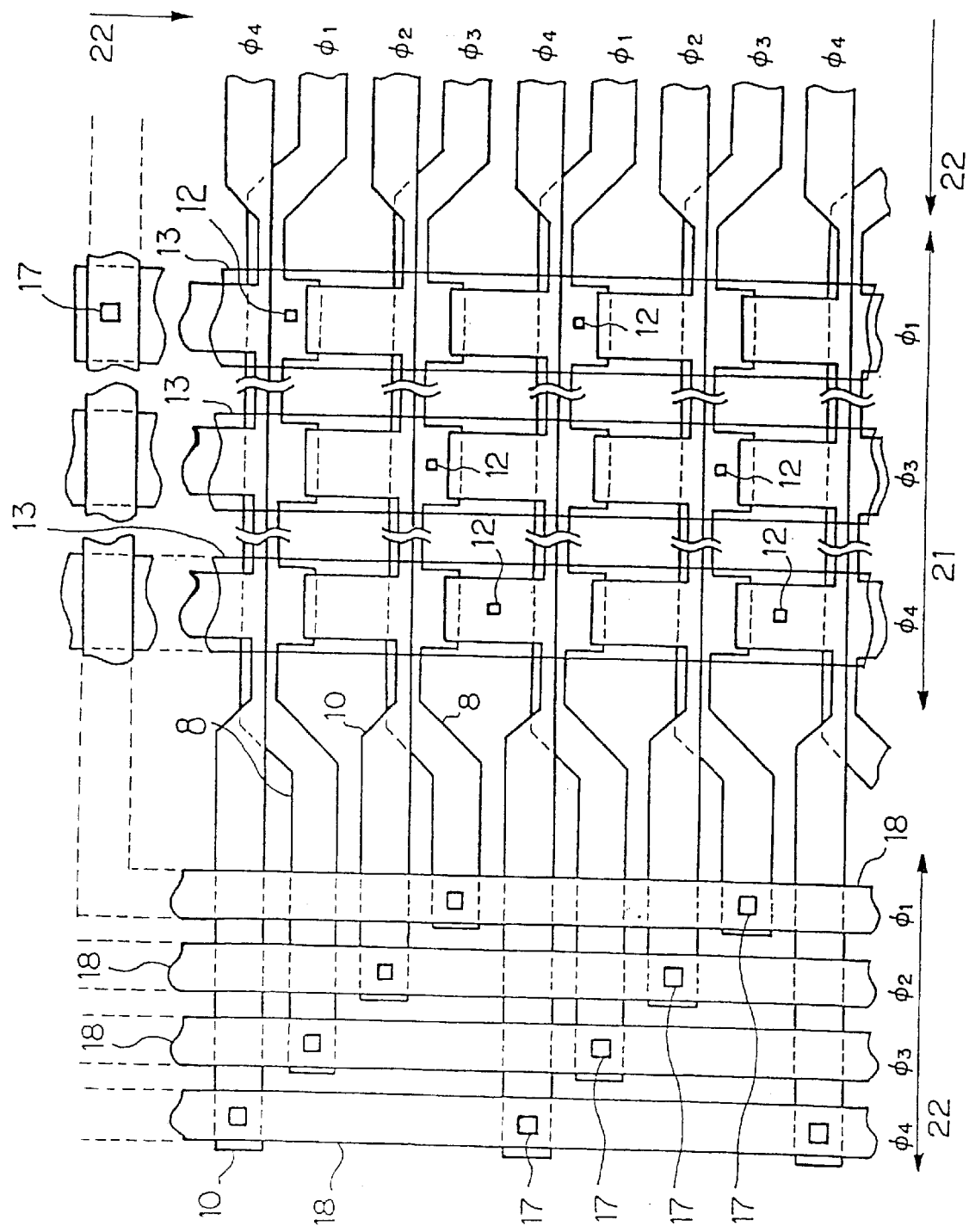
FIG. 4 is a plan view showing the first embodiment of a semiconductor device of the present invention.

Explanation is first given regarding the first embodiment of the present invention. As shown in FIG. 4, the semiconductor device of this embodiment has image-sensing section 21 that converts light received in the central portion to electrical signals, this image-sensing section 21 being enclosed on three sides, i.e., to the right and left and above, by wiring section 22.

Wiring section 22 is made up of charge transfer electrodes 8 and 10 that impress voltage for extracting electrical signals imaged by image-sensing section 21; and wiring 18 that supplies a stipulated voltage to charge transfer electrodes 8 and 10 by way of through-holes 17.

This embodiment is a CCD-type solid-state image-sensing device of four-phase drive with charge transfer electrodes 8 and charge transfer electrodes 10 alternately arranged in image-sensing section 21 and voltage of four sets Φ1–Φ4 being repeatedly impressed in turn from above to these charge transfer electrodes.

In addition, wiring 18 is connected to shield film 13 above image-sensing section 21 by way of through-hole 17, and shield film 13 is connected to charge transfer electrodes 8 and charge transfer electrodes 10 by way of contacts 12.

Because the connections to charge transfer electrodes 8 and 10 from the left and right of image-sensing section 21 are in parallel with the connections from above, the connections from the left and right can be omitted.

Figure 5:
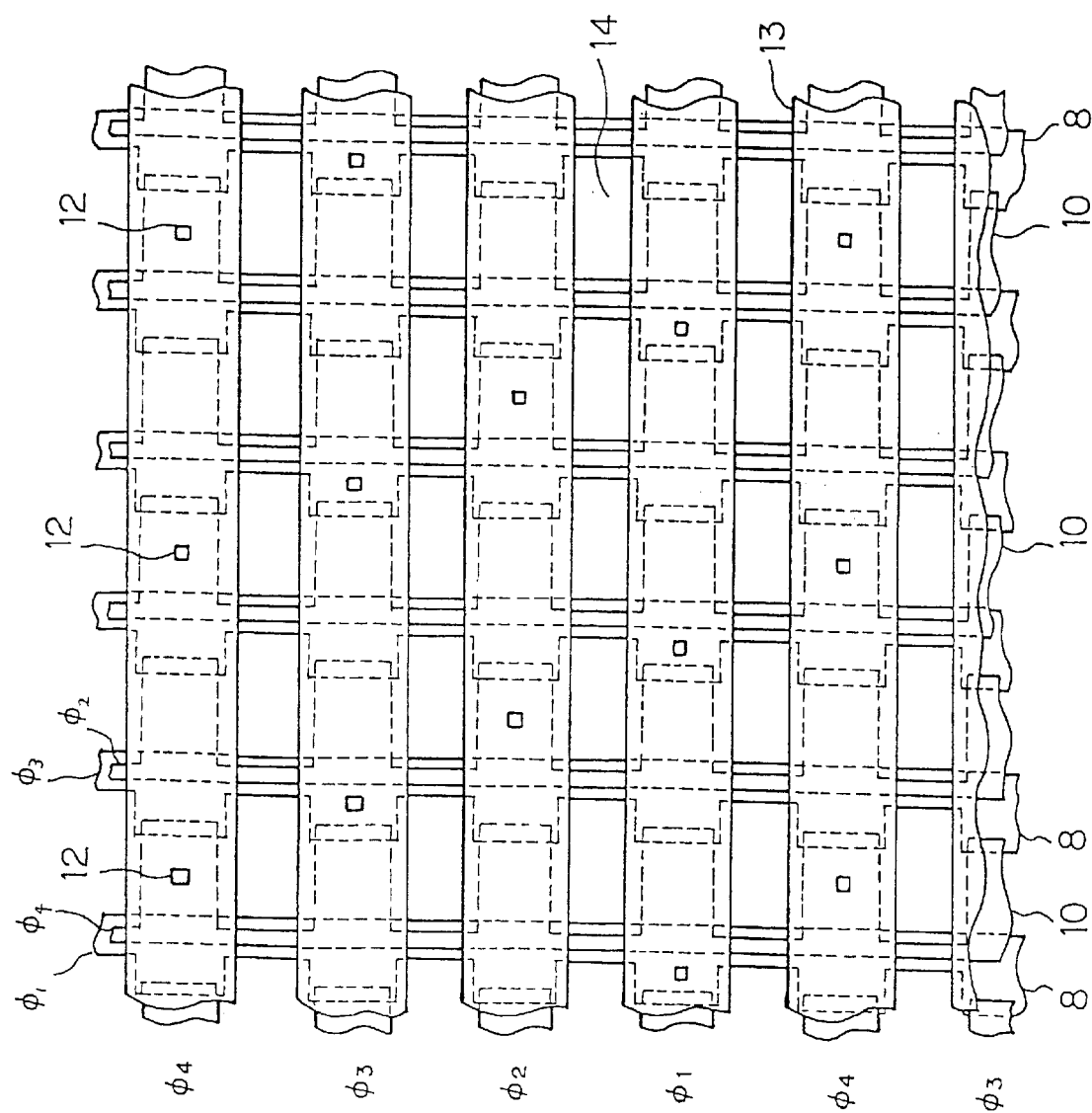
FIG. 5 is a plan view showing the construction of image-sensing section 21 of the semiconductor device shown in FIG. 4.

FIG. 5 is a plan view showing the structure of image-sensing section 21 of the semiconductor device of FIG. 4. This figure shows the configuration of connections between charge transfer electrodes 8 and 10, shield film 13, and contacts 12.

Figure 6:
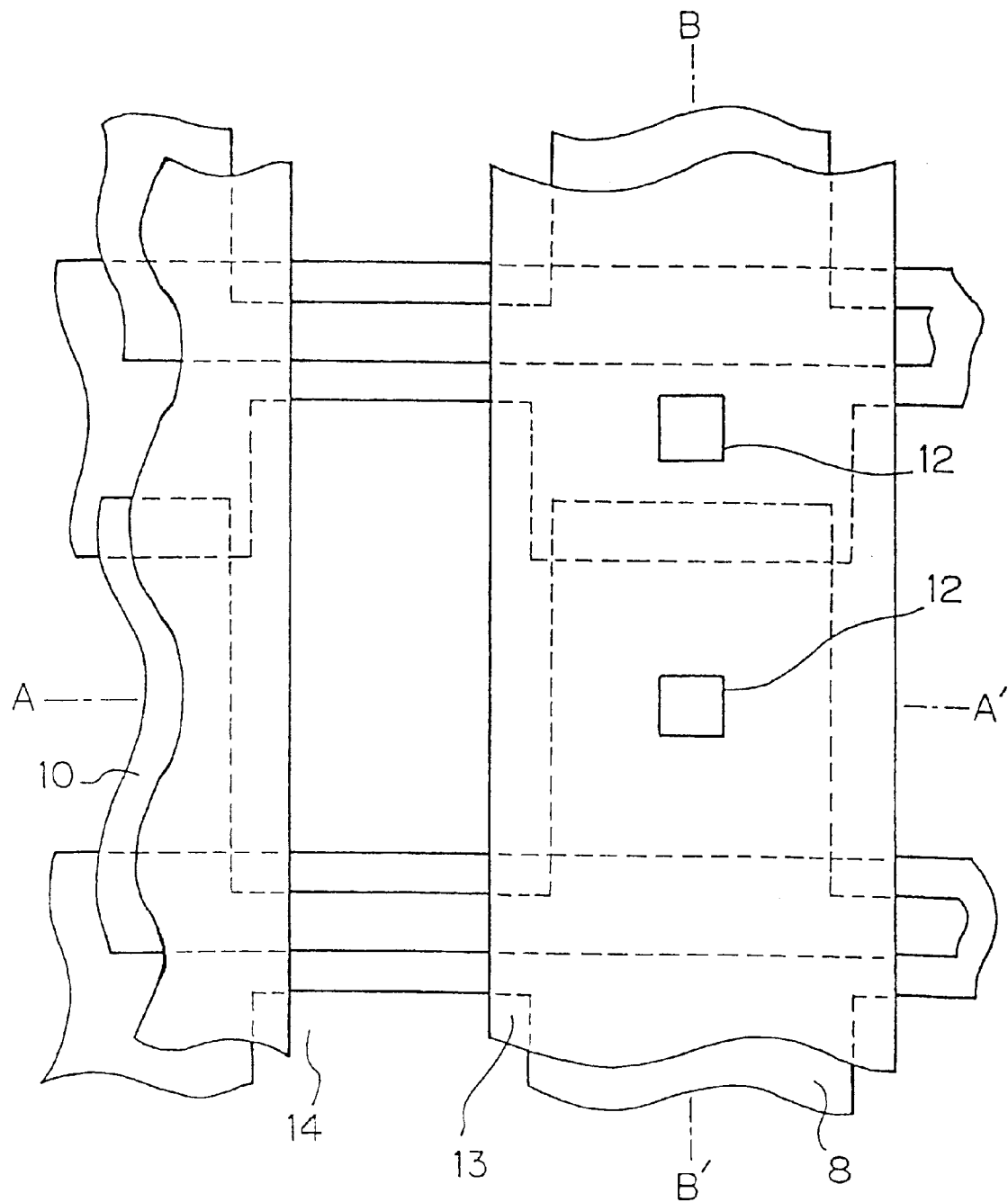
FIG. 6 is an enlarged detail of a portion of image-sensing section 21 of the semiconductor device of FIG. 5.

FIG. 6 shows an enlarged partial view of one picture element in a CCD-type solid-state image-sensing device. As shown in FIG. 5, contacts 12 are actually provided at one position for every four charge transfer electrodes, but for the sake of simplifying the explanation, a case is described in which two contacts 12 are provided for one picture element in FIG. 6 and subsequent figures.

Figure 7A:
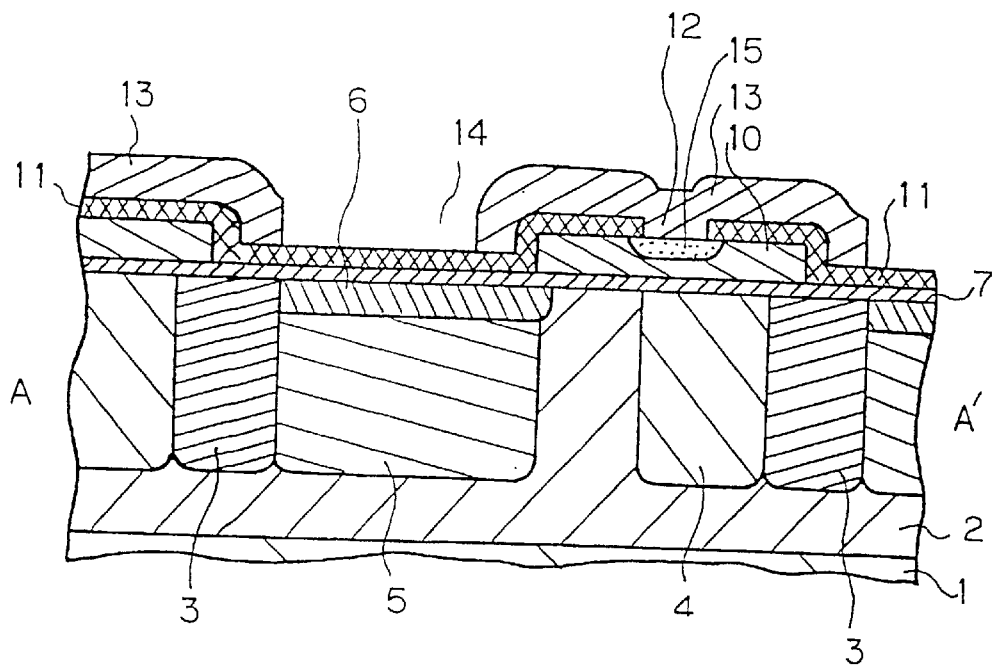
FIG. 7a is a schematic sectional view of the semiconductor device of FIG. 6 taken at line A–A'.
Figure 7B:
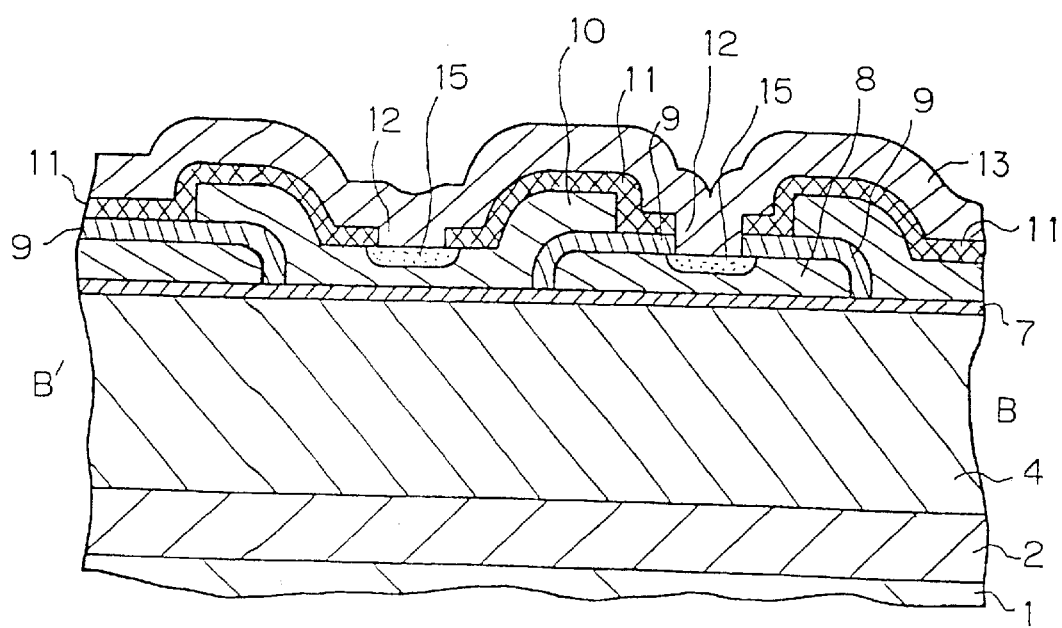
FIG. 7b is a schematic sectional view taken at line B–B'.

Next, FIG. 7a shows a schematic sectional view of the A–A' plane of FIG. 6 of the semiconductor device of the present embodiment, and FIG. 7b shows a schematic sectional view of the B–B' plane of FIG. 6.

The semiconductor device of this embodiment is constructed from: p-well 2 formed by introducing a p-type impurity into the surface of n-type silicon substrate 1; p-type isolation region 3, n-type charge transfer region 4, n-type photoelectric conversion region 5, and p$^+$-region 6 formed by introducing an impurity into the surface of p-well 2; gate insulation film 7 formed on p-well 2; charge transfer electrode 8 composed of polysilicon formed on gate insulation film 7; oxide film 9 formed so as to cover charge transfer electrode 8 and having contacts 12 on charge transfer electrodes 8; charge transfer electrode 10 composed of polysilicon formed on oxide film 9 and gate isolation film 7; oxide film 11 formed so as to cover charge transfer electrode 10 and having contacts 12 on charge transfer electrode 10; barrier metal layer 15 made up of a metal silicide formed on the surface of charge transfer electrodes 8 and 10 exposed within contacts 12; and shield film 13 formed over contacts 12 and oxide film 11.

The semiconductor device of this embodiment allows a reduction of the influence of shield film 13 upon the transmission efficiency of channel potential by incorporating barrier metal layer 15 between shield film 13 and charge transfer electrodes 8 and 10.

Metal silicide such as tungsten silicide, titanium silicide, and platinum silicide can be used in the barrier metal layer 15.

Shield film 13 may be a single layer of a metal silicide or a metal such as tungsten, aluminum, aluminum alloy, and tungsten alloy; or may be a multiple layer of two or more types of metal films or a multilayered film of metal film and a metal silicide film.

In addition, shield film 13 need not be a metal film, but may be formed from a single layer or multiple layers of a material having conductivity.

An explanation of the manufacturing method of the semiconductor device of this embodiment is next presented using the schematic sectional views of FIGS. 7a and 7b, FIGS. 8a and 8b, and FIGS. 9a and 9b. Equivalent constituent features in FIGS. 8a and 8b, 9a and 9b and in FIGS. 7a and 7b are identified by the same reference numerals.

P-type impurity is introduced into the surface of n-type silicon substrate 1 to form p-well 2. P-type isolation region 3, n-type charge transfer region 4, n-type photoelectric conversion region 5, and p$^+$ region 6 are then each formed by introducing impurity into the surface of p-well 2.

Figure 8A:
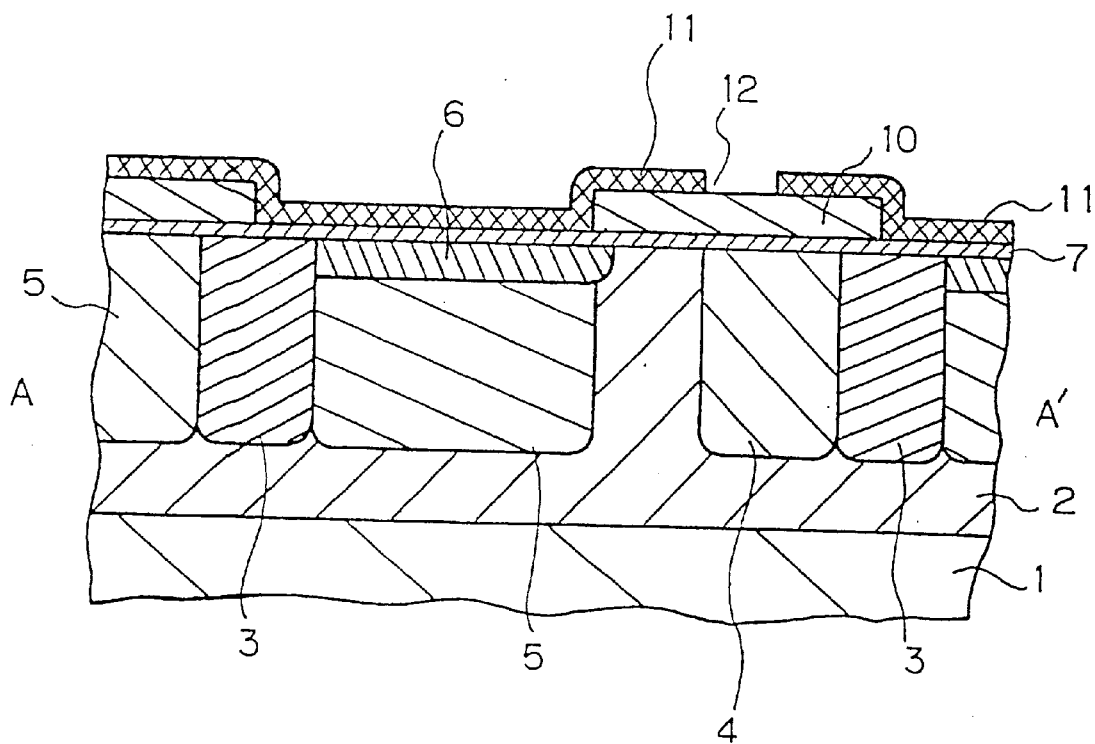
FIGS. 8a and 8b are schematic sectional views of the semiconductor device of FIGS. 7a and 7b midway in the fabrication process.
Figure 8B:
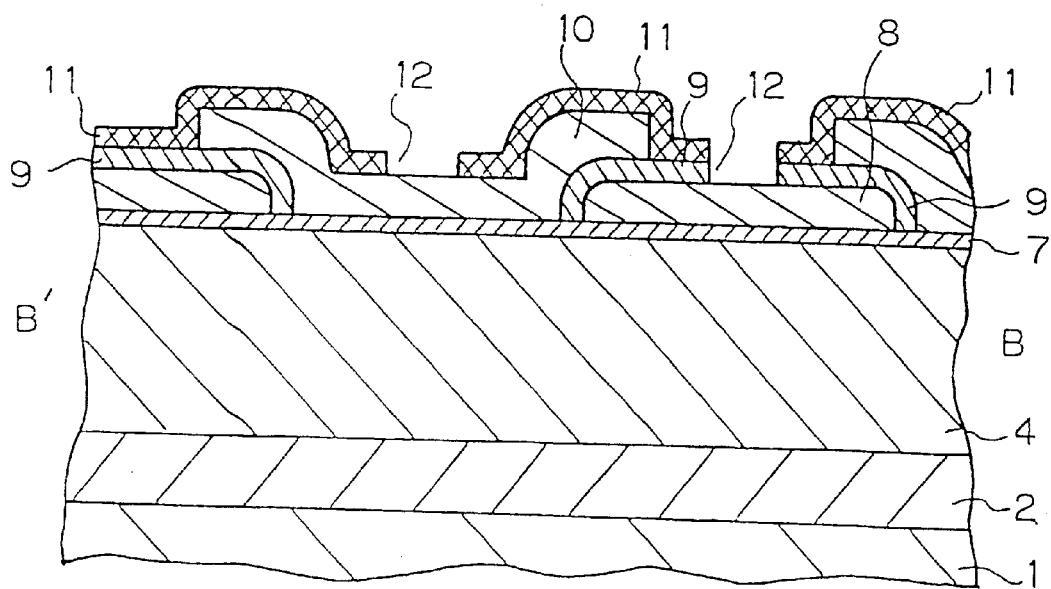
Figure 9A:
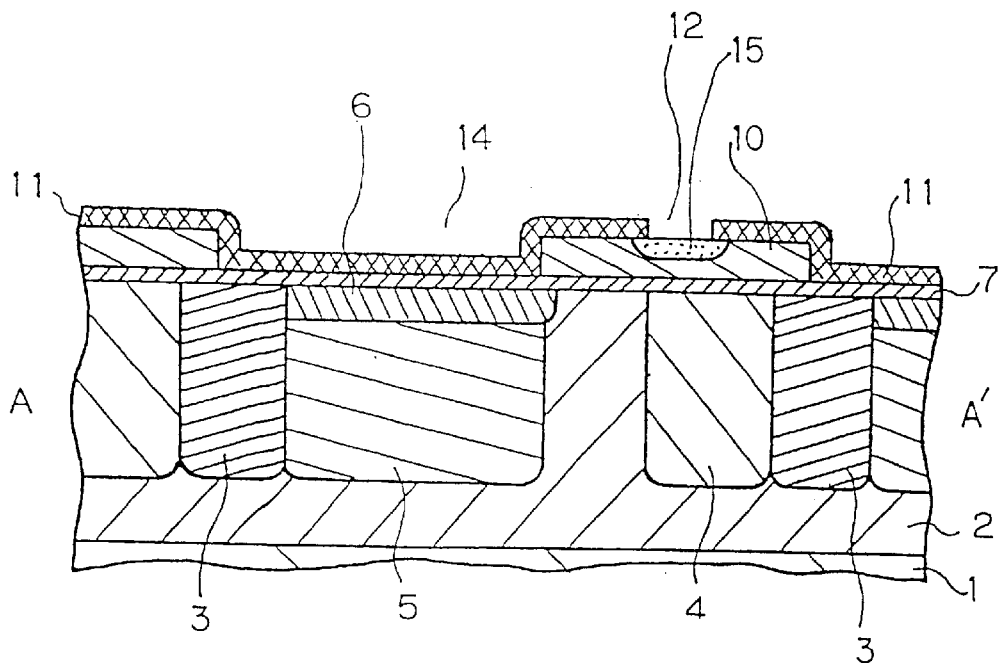
FIGS. 9a and 9b are schematic sectional views of the semiconductor device of FIGS. 7a and 7b midway in the fabrication process.
Figure 9B:
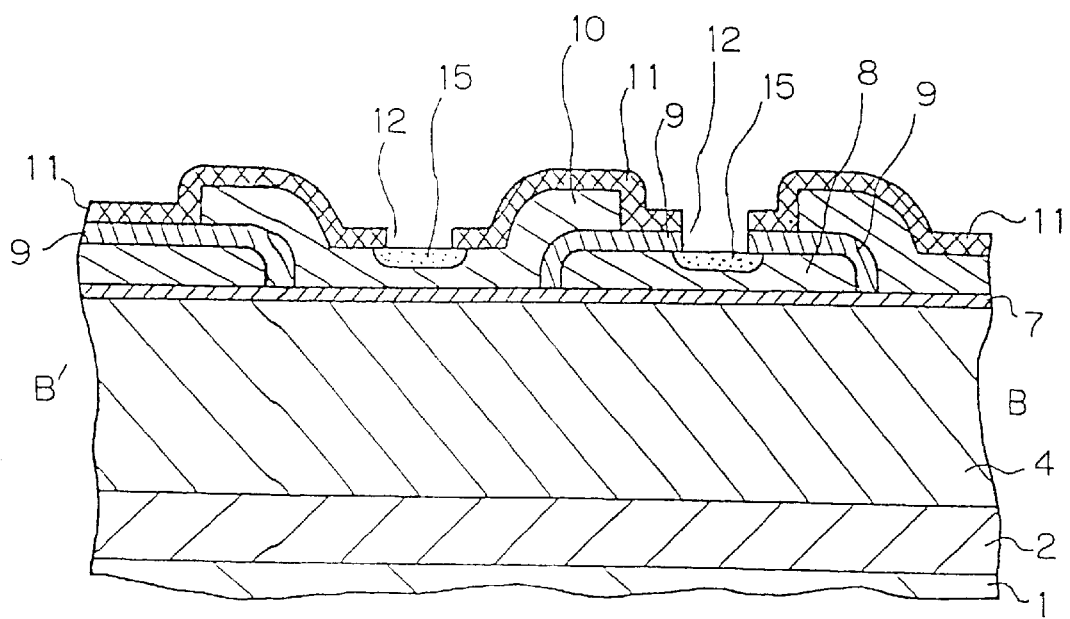
Figure 10A:
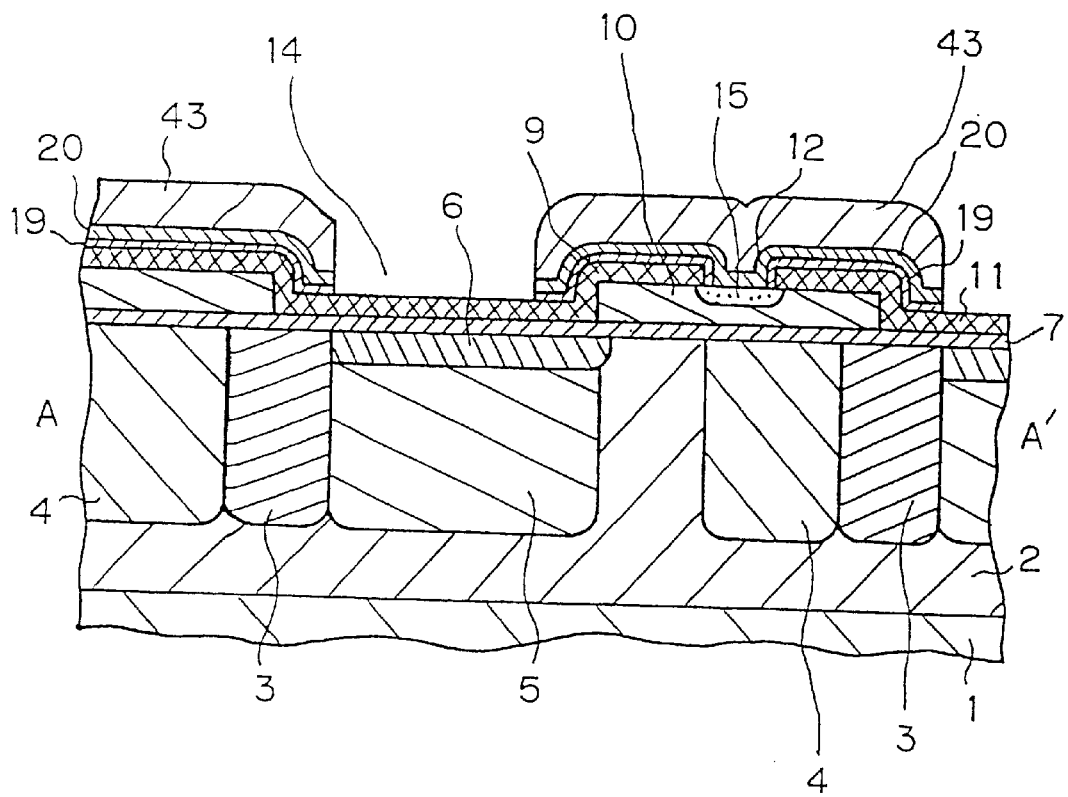
FIG. 10a is a schematic sectional view of FIG. 6 taken at line A–A'.
Figure 10B:
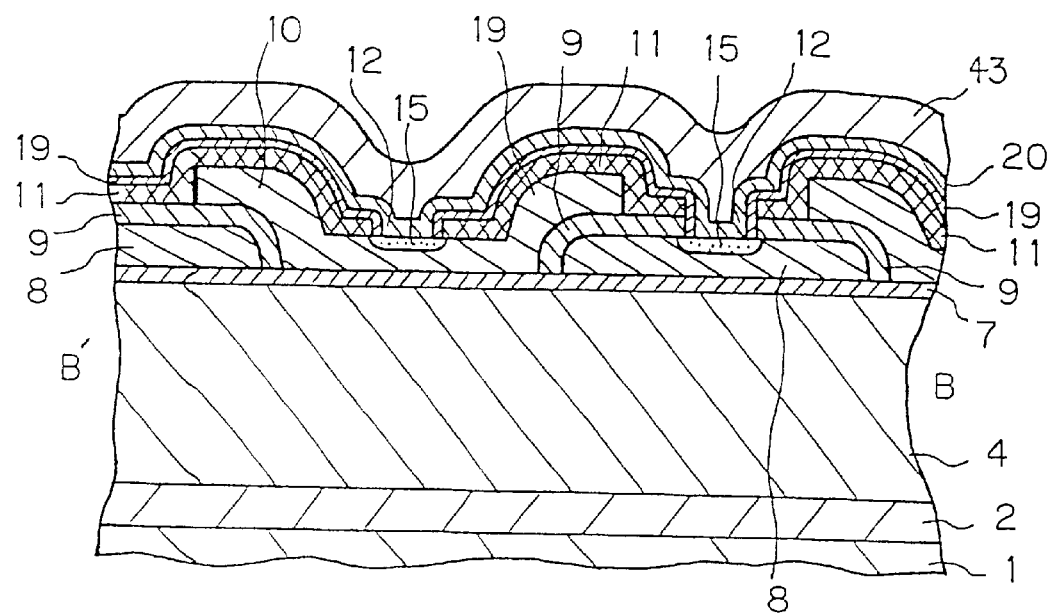
FIG. 10b is a schematic sectional view taken at line B–B' of the semiconductor device of the second embodiment of the present invention.

Gate insulation film 7 made up of a multiple-layer film of oxide film and nitride film or of a single-layer film is next formed. Polysilicon containing, for example, phosphorus, is deposited and then patterned to form charge transfer electrodes 8. The periphery of charge transfer electrodes 8 is then oxidized by thermal oxidation and an oxide film 9 formed. Polysilicon containing, for example, phosphorus, is then deposited and patterned to form charge transfer electrodes 10. Oxide film 11 is then deposited, following which contacts 12 are formed in oxide film 11 and oxide film 9. FIGS. 8a and 8b are schematic sectional views at the time of completion of these processes.

A titanium film having a film thickness on the order of 300~1000 Å is then deposited over the entire surface. A heat treatment at about 700° C. and lasting approximately 10~20 seconds is then carried out to bring about reaction between the titanium film and charge transfer electrodes 8 or charge transfer electrodes 10, thereby forming barrier metal layer 15 composed of titanium silicide. Here, the titanium film over oxide film 11 is not converted to a silicide and remains unchanged. Unreacted titanium film is then removed by dilute hydrofluoric acid. FIGS. 8a and 8b are schematic sectional views at the time of completion of these processes. Although the titanium film is removed in this embodiment, it may also be left as is.

Tungsten or the above-described film is then deposited to a film thickness of, for example, 2000~5000 Å, and patterning is carried out to form shield film 13.

Second Embodiment

Explanation of the semiconductor device according to the second embodiment of the present invention is next presented with reference to FIG. 6 and FIGS. 10a and 10b, FIGS. 11a and 11b. Constituent elements that are equivalent to components in FIGS. 7a and 7b are identified by the same reference numerals.

The semiconductor device of this embodiment employs three layers, i.e., titanium film 19, titanium nitride film 20, and tungsten film 43, in place of shield film 13 used in the semiconductor device of the first embodiment.

Regarding the method of manufacturing the semiconductor device of this embodiment, fabrication processes of this embodiment are equivalent to those for the first embodiment up to the formation of contacts 12, at which point, titanium film 19 having a film thickness of 300~1000 Å is deposited over the entire surface. A heat treatment of about 10~20 seconds at a temperature of about 700° C. is then carried out, whereby titanium film 19 reacts with charge transfer electrodes 8 or charge transfer electrodes 10, and barrier metal layer 15 composed of titanium silicide is formed. Schematic sectional views at the time of completion of these processes are equivalent to those of FIGS. 9a and 9b.

Figure 11A:
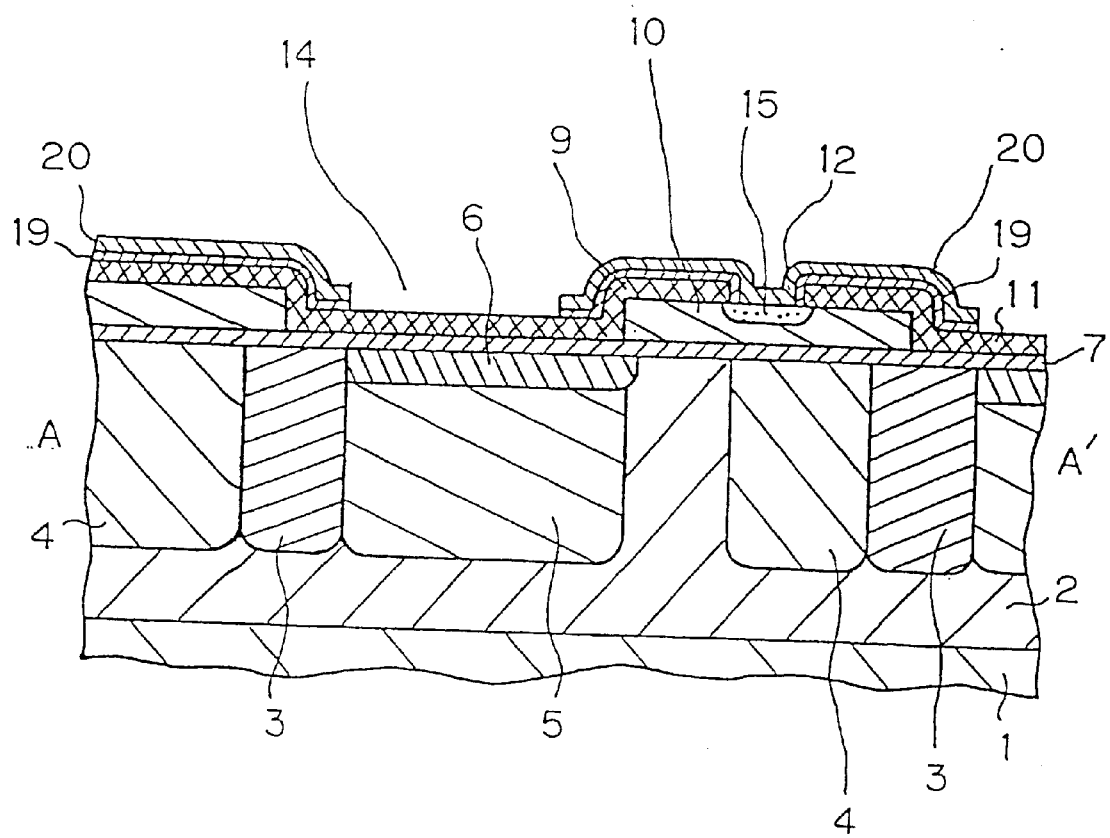
FIGS. 11a and 11b are schematic sectional views of the semiconductor device of FIGS. 10a and 10b midway in the fabrication process.
Figure 11B:
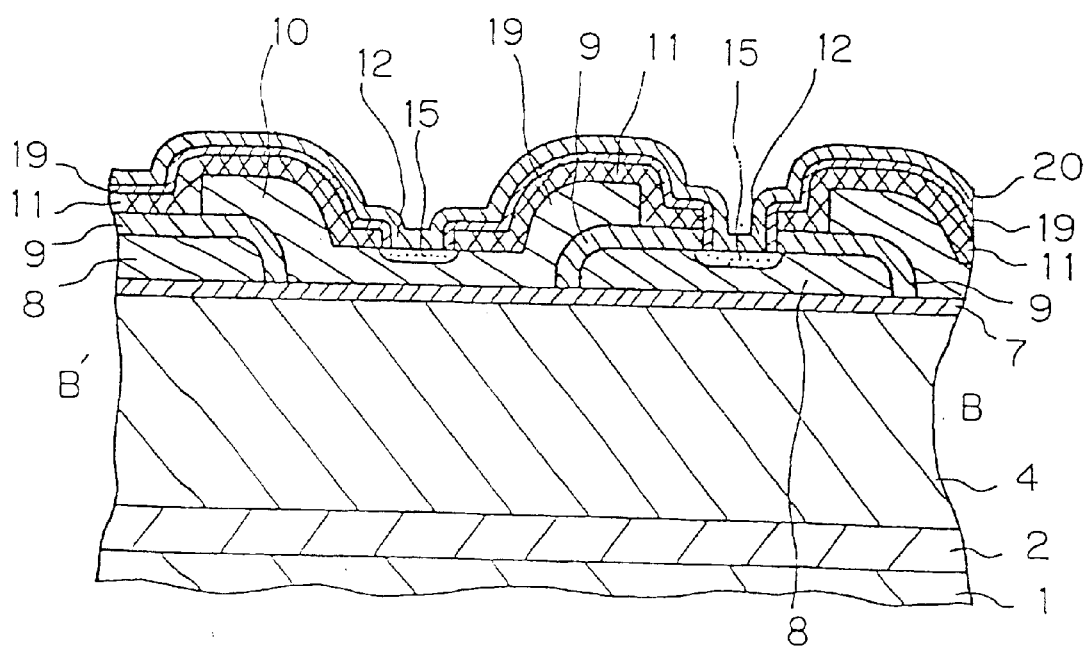
Figure 12A:
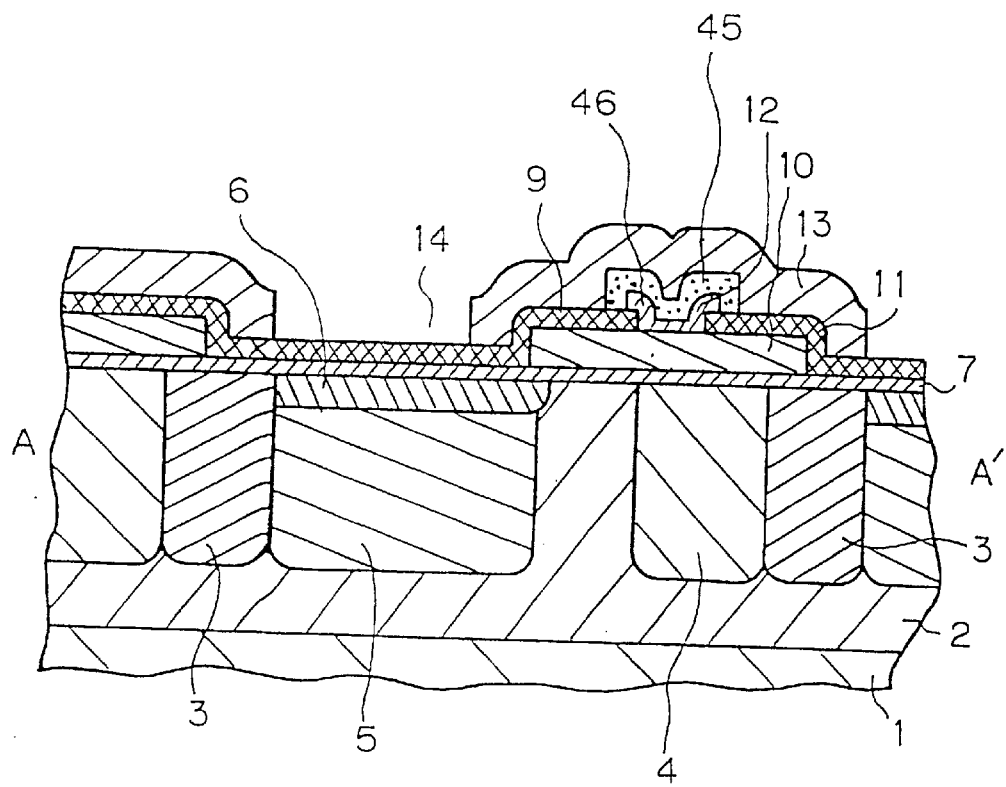
FIG. 12a is a schematic sectional view of FIG. 6 taken at line A–A'.
Figure 12B:
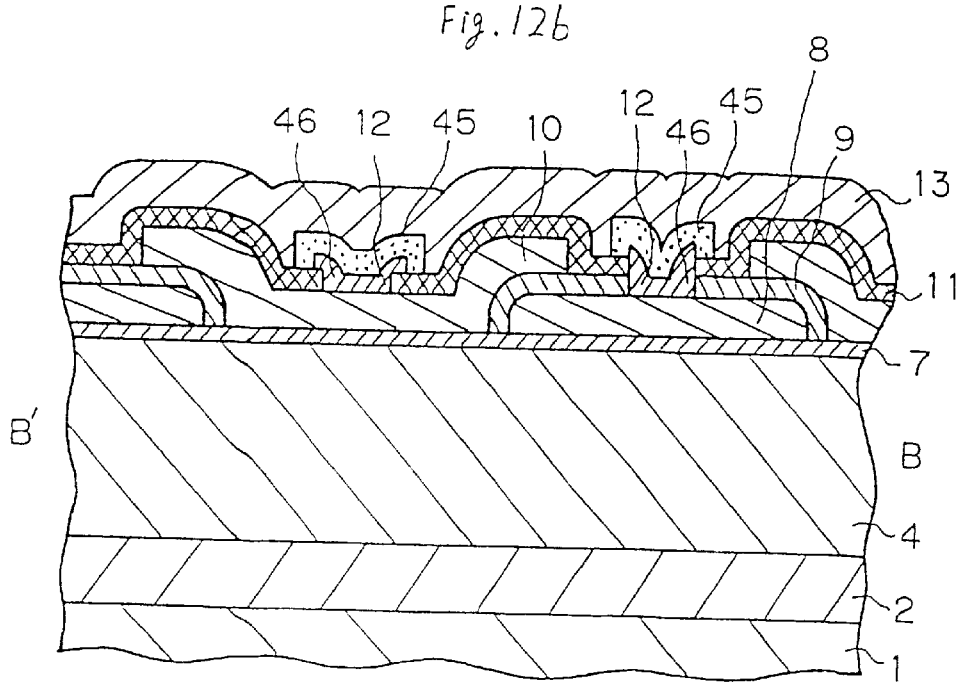
FIG. 12b is a schematic sectional view taken at line B–B' of the semiconductor device of the third embodiment of the present invention.

Titanium nitride film 20 is then deposited to a film thickness on the order of 1000 Å, and tungsten is deposited. FIGS. 11a and 11b are schematic sectional views at the time of completion of these processes. Finally, patterning carried out to form tungsten film 43.

This embodiment allows an improvement in the contact between tungsten film 43 and oxide film 9 by means of titanium nitride film 20, and in addition, because titanium nitride film 20 can serve as an etching barrier during patterning of tungsten film 43, allows a reduction of damage to oxide film 9, which serves as ground during etching, thereby facilitating micro-patterning of tungsten film 43.

In this embodiment, titanium film 19 alone can be used without using titanium nitride film 20. A method in which titanium film 19 or titanium nitride film 20 is left as in this embodiment may also be used in the third to sixth embodiments, to be described hereinbelow.

Third Embodiment

Explanation is next presented regarding a semiconductor device according to the third embodiment of the present invention with reference to FIG. 6 and FIGS. 12a and 12b, FIGS. 13a and 13b, and FIGS. 14a and 14b. In these figures, constituent elements that are equivalent to elements in FIGS. 7a and 7b are identified by the same reference numerals.

In the semiconductor device of this embodiment, polysilicon layer 46 made up of polysilicon is formed at the portions in which contacts 12 are provided over charge transfer electrodes 8 and 10, and barrier metal layer 45 is formed over polysilicon layer 46.

Figure 13A:
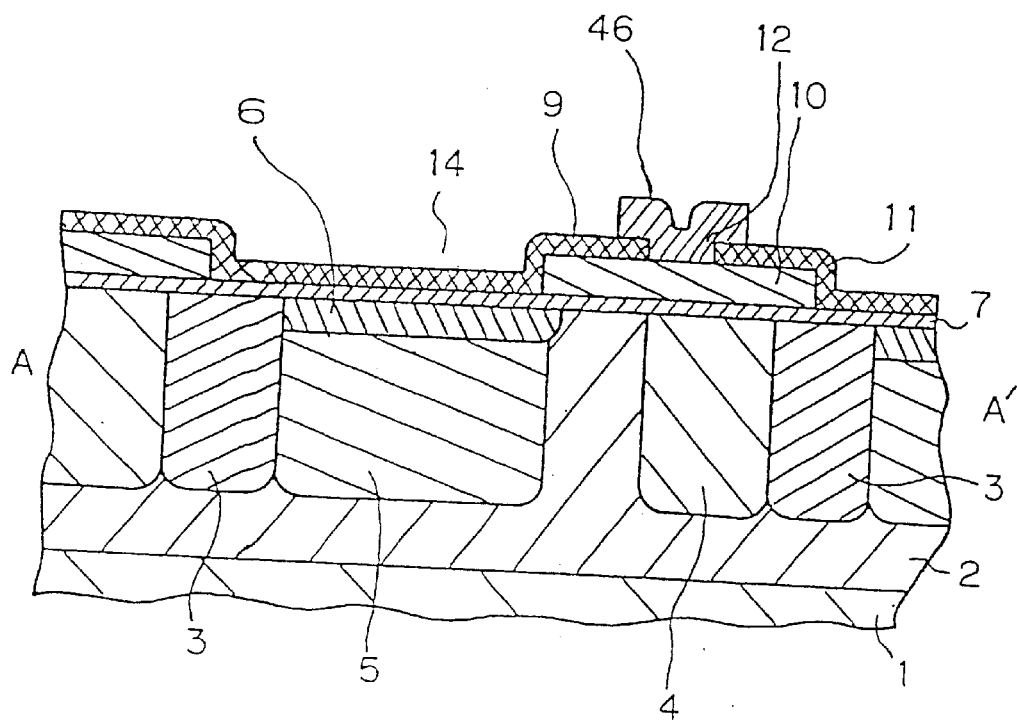
FIGS. 13a and 13b are schematic sectional views of the semiconductor device of FIGS. 12a and 12b midway in the fabrication process.
Figure 13B:
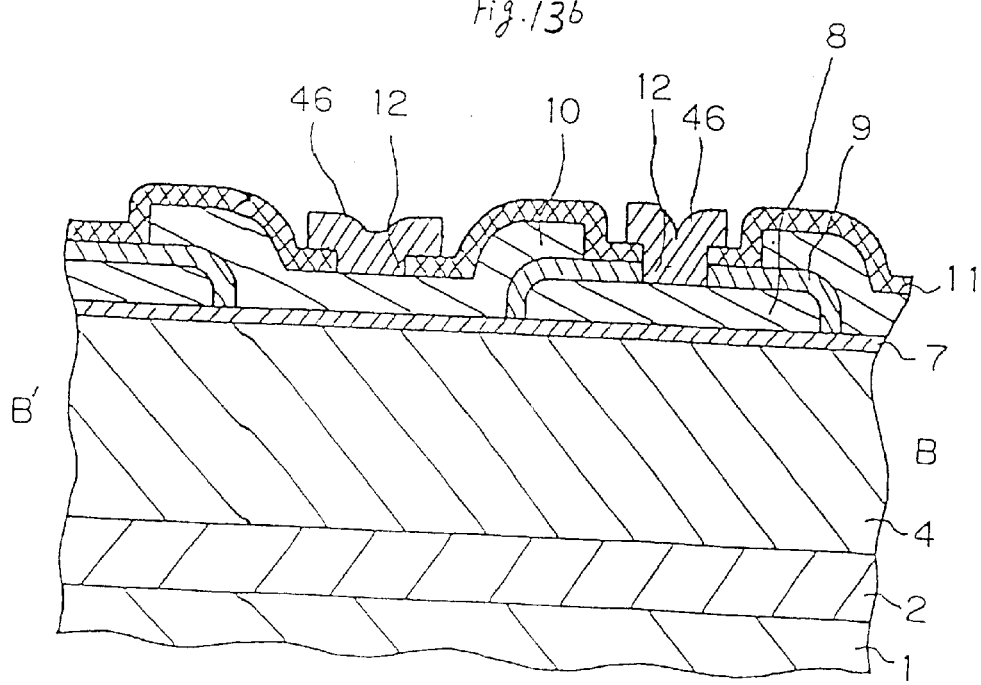

Regarding the method of manufacturing a semiconductor device of this embodiment, the fabrication processes are equivalent to the processes of the first embodiment up to the formation of contacts 12, following which polysilicon layer 46 containing an impurity such as phosphorus is deposited and patterning carried out. FIGS. 13a and 13b are schematic sectional views at the time of completion of these processes.

Figure 14A:
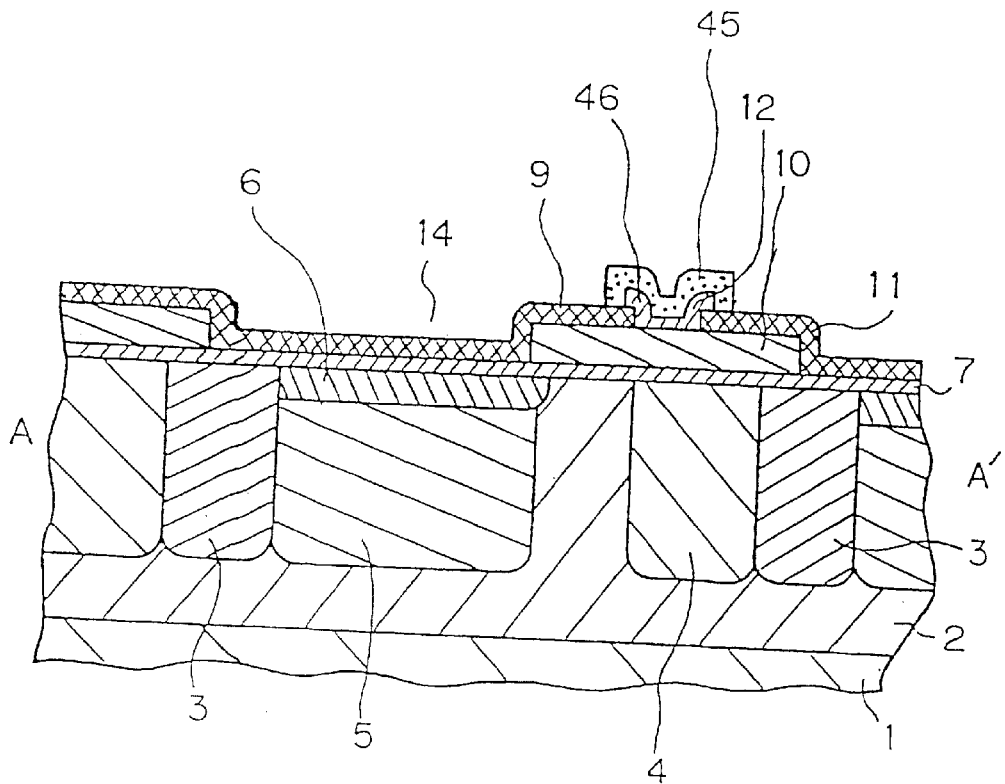
FIGS. 14a and 14b are schematic sectional views of the semiconductor device of FIGS. 12a and 12b midway in the fabrication process.
Figure 14B:
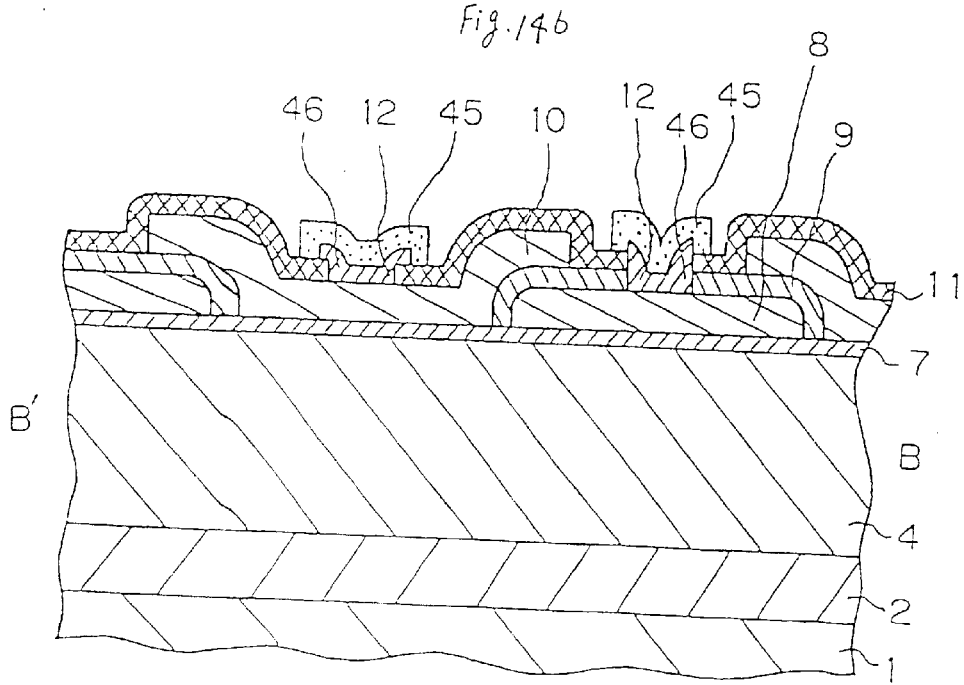

A titanium film having a film thickness on the order of 300·1000 Å is next deposited over the entire surface. A heat treatment is then carried out at about 700° C. for 10–20 seconds, whereby the titanium film and polysilicon layer 46 are caused to react to form barrier metal layer 45 made up of titanium silicide. FIGS. 14a and 14b are schematic sectional views at the time of completion of these processes. Subsequent processes for forming shield film 13 are the same as for the semiconductor device according to the first or second embodiment.

In the semiconductor device of the present embodiment, the film thickness of polysilicon layer 46 that remains without being converted to titanium silicide can be increased even though the surface of polysilicon layer 46 is converted to titanium silicide due to the effect of the titanium film because yet another polysilicon layer 46 is included over charge transfer electrodes 8 and charge transfer electrodes 10. As a result, charge transfer electrodes 8 or charge transfer electrodes 10 can be made thin-films, the evenness of layers can be improved, the coverage of shield film 13 can be improved, and the occurrence of defects resulting from etching residue can be decreased.

Fourth Embodiment

Explanation of a semiconductor device according to the fourth embodiment of the present invention is next presented with reference to FIG. 6 and FIGS. 15a and 15b, and FIGS. 16a and 16b. Constituent elements that are equivalent to elements in FIGS. 7a and 7b are identified by the same reference numerals.

In contrast with the first embodiment, polysilicon is buried within contacts 12 in the semiconductor device of this embodiment, and this polysilicon is converted to silicide. Regarding the method of manufacturing a semiconductor device according to this embodiment, fabrications processes are equivalent to those of the first embodiment up to the formation of contacts 12. From this point, polysilicon is buried in contacts 12. The burying process may employ any of various methods, including a method of selectively growing polysilicon only on the exposed portions of charge transfer electrodes 8 and 10 at the portions of contacts 12; or a method in which polysilicon is deposited over the entire wafer surface and removed by etching or a CMP (Chemical Mechanical Polish) process such that polysilicon is left only in the interior of contacts 12.

The introduction of an impurity to this polysilicon may be effected simultaneously with deposition of the polysilicon, or by ion implantation or solid-phase diffusion following deposition of non-doped polysilicon. The impurity here is the same type as used in charge transfer electrodes 8 and 10. In addition, the introduction of an impurity to the polysilicon at this stage is not necessary if conduction between charge transfer electrodes 8 and 10 is at sufficiently low resistance due to barrier metal layer 47 of subsequent processes.

Figure 16A:
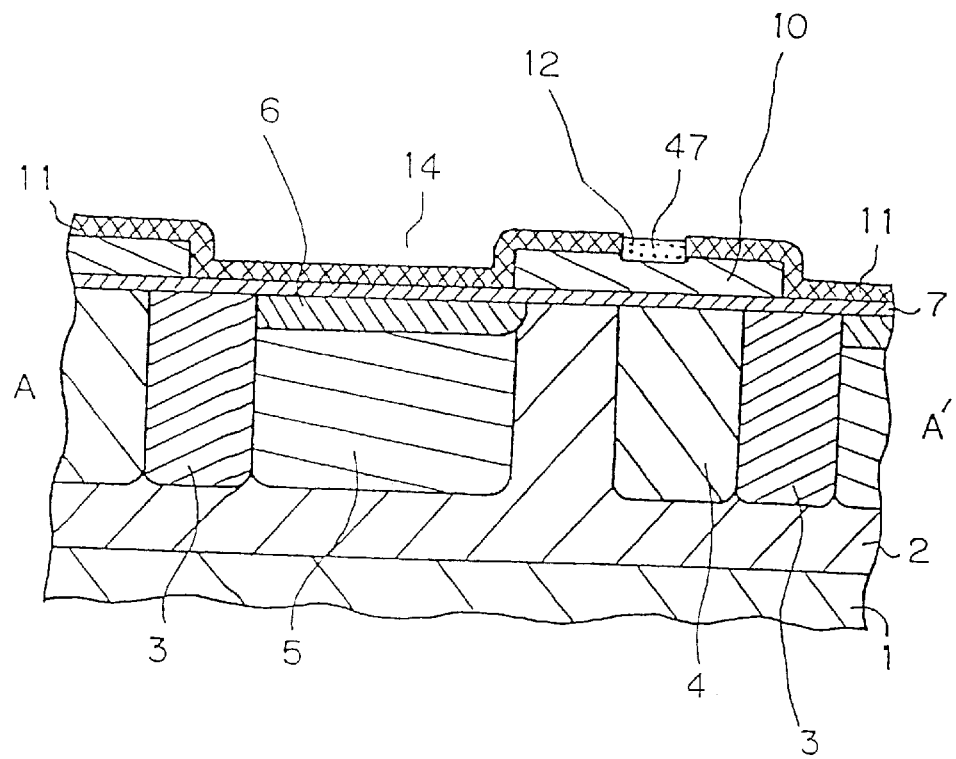
FIGS. 16a and 16b are schematic sectional views of the semiconductor device of FIGS. 15a and 15b midway in the fabrication process.
Figure 16B:
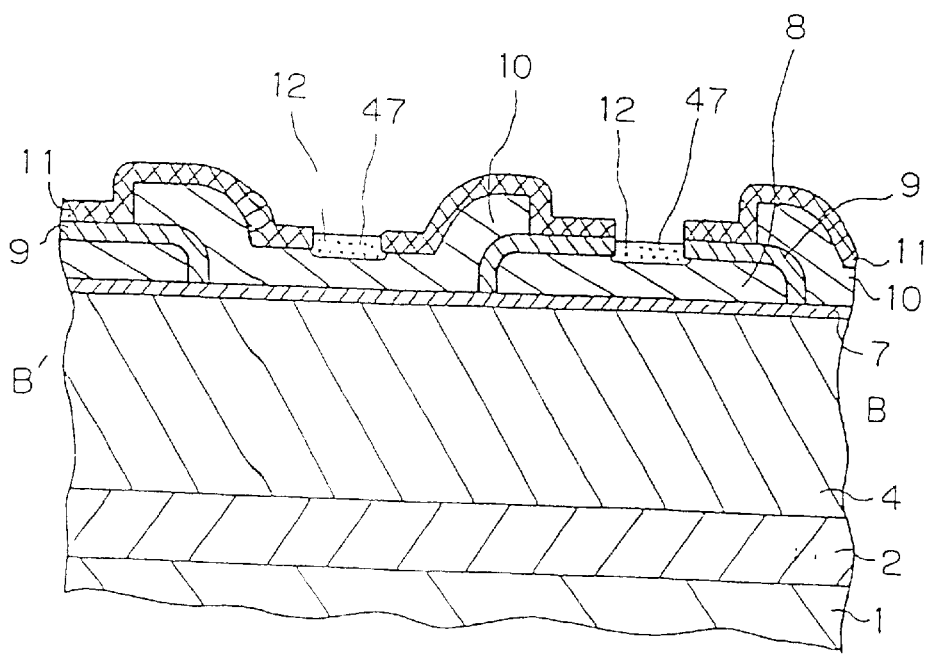

A titanium film is next deposited over the entire surface to a thickness on the order of 300–1000 Å. Heat treatment is then carried out at about 700° C. for 10–20 seconds, the titanium film and the polysilicon caused to react, and a barrier metal layer 47 composed of titanium silicide thereby created. FIGS. 16a and 16b are schematic sectional views at the time of completion of these processes. The following processes in which shield film 13 is formed are equivalent to the processes for the semiconductor device of the first or second embodiment.

Figure 15A:
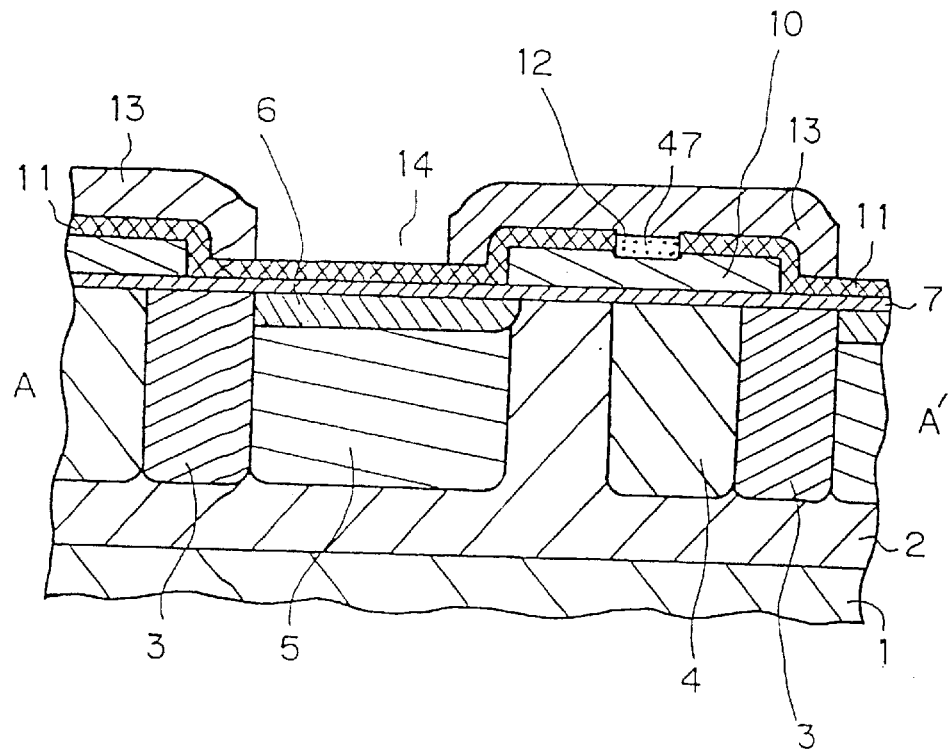
FIG. 15a is a schematic sectional view of FIG. 6 taken at line A–A'.
Figure 15B:
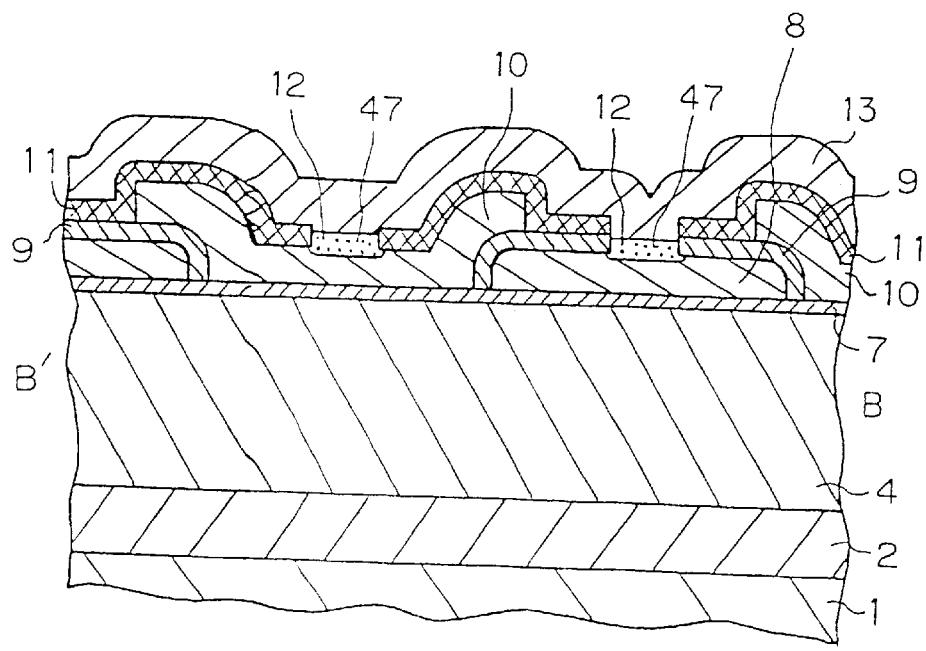
FIG. 15b is a schematic sectional view taken at line B–B' of the semiconductor device of the fourth embodiment of the present invention.

In FIGS. 15a and 15b, a portion of charge transfer electrodes 10 is also converted to titanium silicide to form barrier metal film 47 in addition to the polysilicon buried within contacts 12, but the thickness of contacts 12 may in some cases result in charge transfer electrodes 10 being left unchanged without any conversion to titanium silicide.

In the semiconductor device of this embodiment, the formation of barrier metal layer 47 by means of titanium silicide within contacts 12 over charge transfer electrodes 8 and charge transfer electrodes 10 enables the formation of charge transfer electrodes 8 or charge transfer electrodes 10 as thin-films, thereby enabling an improvement in the evenness of the layers, an improvement in the coverage of shield film 13, and a reduction in the occurrence of defects due to etching residue.

Fifth Embodiment

Explanation is next presented regarding a semiconductor device according to the fifth embodiment of the present invention with reference to FIG. 6 and FIGS. 17a and 17b, FIGS. 18a and 18b, and FIGS. 19a and 19b. Constituent elements equivalent to elements in FIGS. 7a and 7b are identified by the same reference numerals.

In contrast to the first embodiment, polysilicon 56 in the semiconductor device of this embodiment is formed so as to bulge up in a hemispherical form over the interior of contacts 12, and the surface of this polysilicon is converted to silicide to form barrier metal layer 55.

Regarding the method of manufacturing a semiconductor device according to this embodiment, the fabrication processes are equivalent to those for the first embodiment up to the formation of contacts 12, at which point polysilicon 56 is selectively deposited only on the exposed portions of charge transfer electrodes 8 and 10 in the interiors of contacts 12.

Figure 18A:
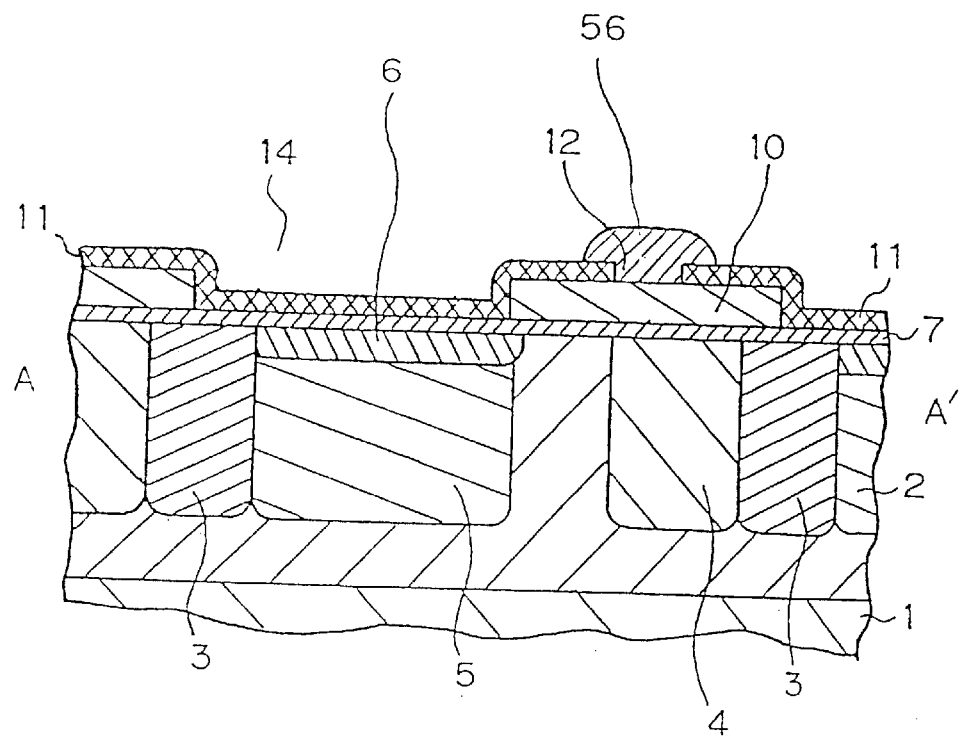
FIGS. 18a and 18b are schematic sectional views of the semiconductor device of FIGS. 17a and 17b midway in the fabrication process.
Figure 18B:
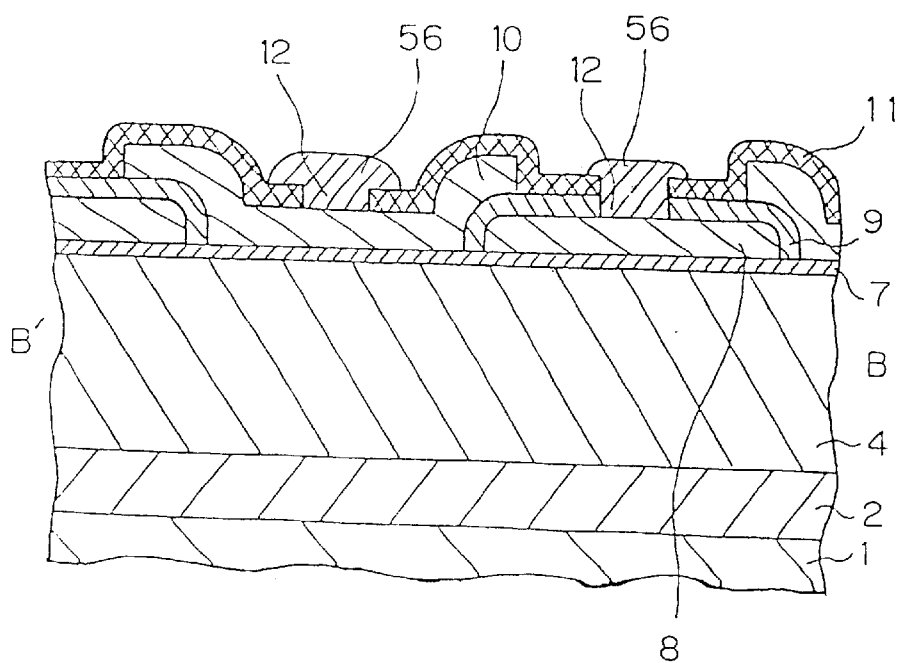

Depositing polysilicon 56 buries the interiors of contacts 12, and continued depositing causes the surface of polysilicon 56 to mound up as a hemisphere with contacts 12 as centers. FIGS. 18a and 18b are schematic sectional views at the time of completion of these processes.

Figure 19A:
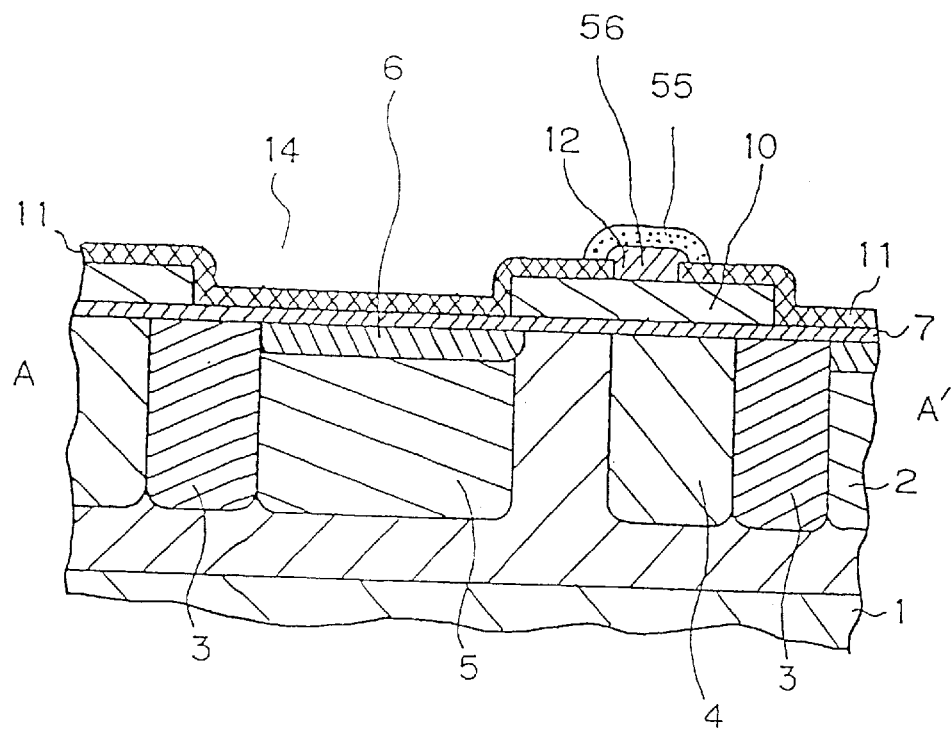
FIGS. 19a and 19b are schematic sectional views of the semiconductor device of FIGS. 17a and 17b midway in the fabrication process.
Figure 19B:
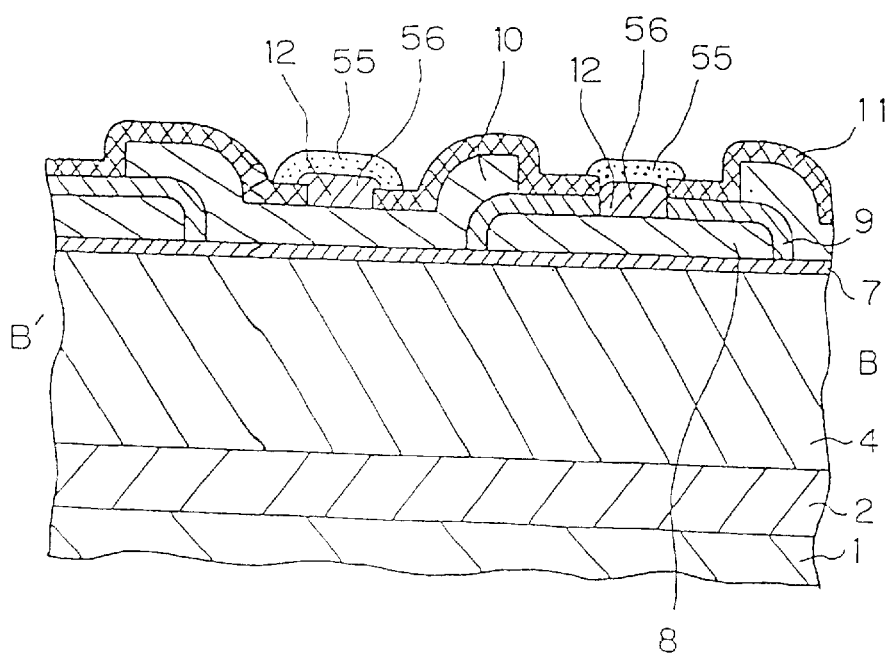
Figure 20A:
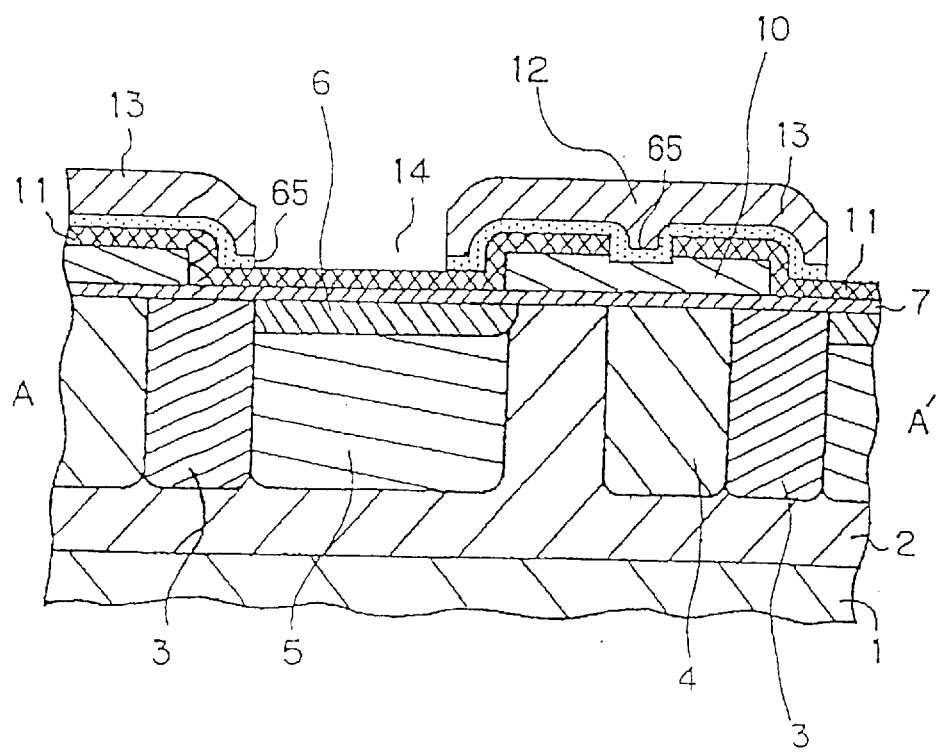
FIG. 20a is a schematic sectional view taken at line A–A'.
Figure 20B:
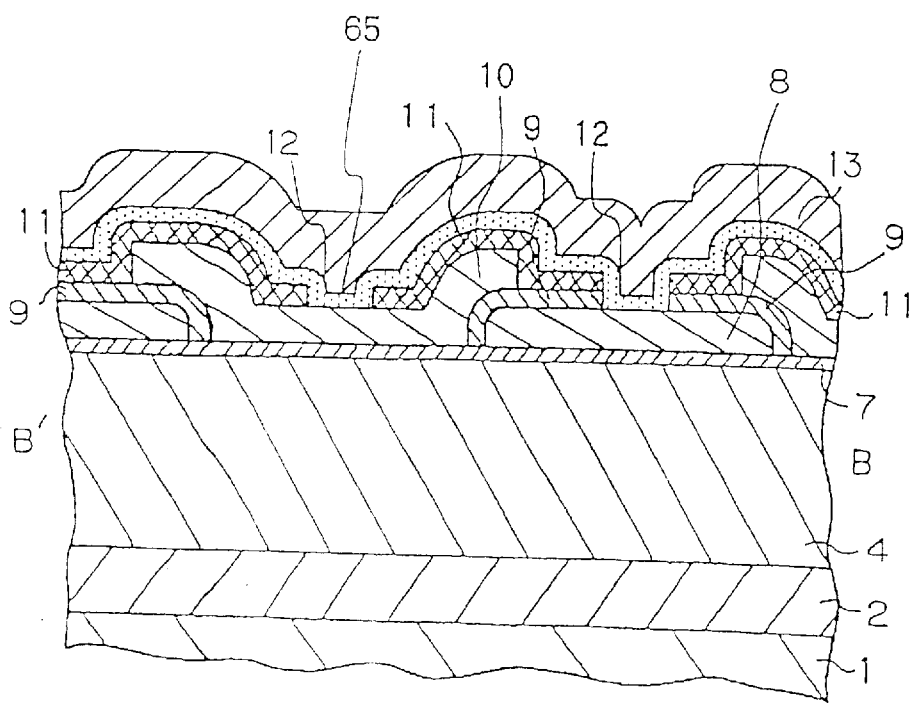
FIG. 20b is a schematic sectional view taken at line B–B' of the semiconductor device of the sixth embodiment of the present invention.

Titanium film is then deposited over the entire surface to a film thickness on the order of 300~1000 Å. A heat treatment at about 700° C. is carried out for 10~20 seconds, whereby titanium film is caused to react with polysilicon 56 to form barrier metal layer 55 composed of titanium silicide. FIGS. 19a and 19b are schematic sectional views at the time of completion of these processes. The subsequent processes for forming shield film 13 are equivalent to those for semiconductor device of the first or second embodiment.

In this embodiment, the use of a polysilicon layer 56 that is mounded up in a hemispherical form enables the maintenance of distance between barrier metal layer 55 and gate insulation film 7 despite the reduction in film thickness of the polysilicon layer 56 that remains after the titanium film reacts with polysilicon layer 56 to convert the surface of polysilicon layer 56 to a silicide and form barrier metal layer 55. In addition, because the surface of barrier metal layer 55 is in a hemispherical form, a further improvement in evenness and coverage of shield film 13 can be obtained as compared with the third embodiment. Further, polysilicon layer 56 in this embodiment is formed by deposition, and photolithography or etching processes are therefore not required for patterning.

Unlike a case such as the fourth embodiment in which polysilicon is buried inside contacts 12 to form a barrier metal layer, the film thickness of which is determined by the film thickness of oxide film 11, the thickness of polysilicon layer 56 can be set at will even if oxide film 11 is thin, and as a result, the position of the edges of shield film 13 is lowered and leakage of light into charge transfer regions 4 can be reduced and smearing decreased.

In this embodiment, moreover, the film thickness of polysilicon layer 56 and charge transfer electrodes 8 or 10 is sufficient, and barrier metal layer 55 therefore need not be used if the influence of shield film 13 does not present a problem.

Sixth Embodiment

Explanation is next presented regarding a semiconductor device according to the sixth embodiment of the present invention with reference to FIG. 6 and FIGS. 20a and 20b, and FIGS. 21a and 21b. Constituent elements that are equivalent to elements in FIGS. 7a and 7b are identified by the same reference numerals.

In the above-described first to fifth embodiments, barrier metal layers were formed by reacting polysilicon and metal to form a metal silicide. In the semiconductor device of this embodiment, barrier metal layer 65 is formed by using a titanium silicide that has been converted to silicide beforehand.

Figure 21A:
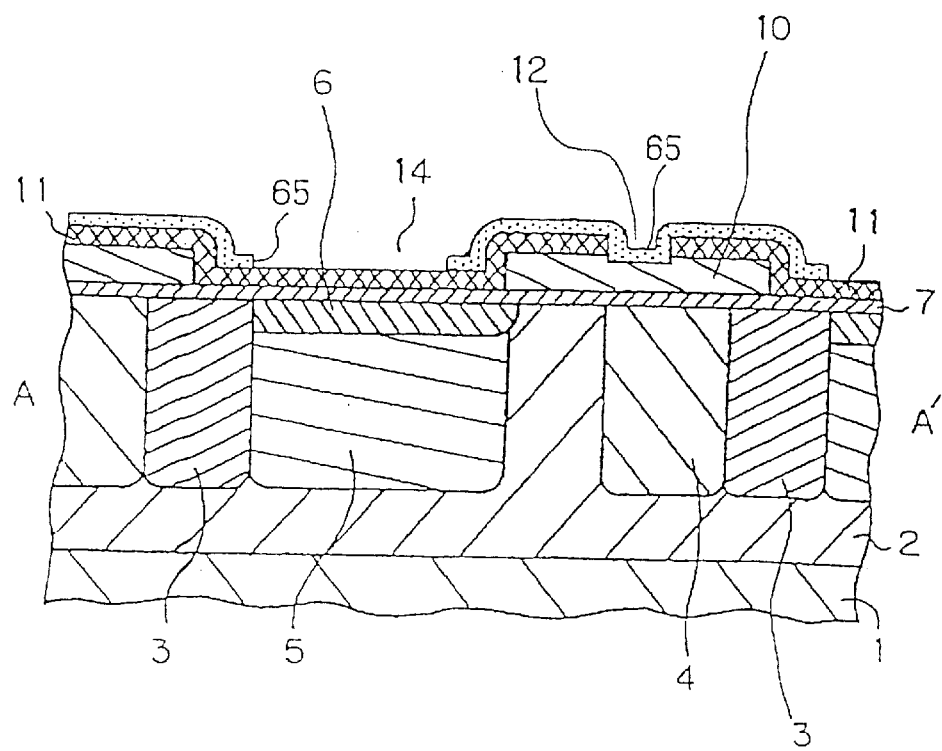
FIGS. 21a and 21b are schematic sectional views of the semiconductor device of FIGS. 20a and 20b midway in the fabrication process.
Figure 21B:
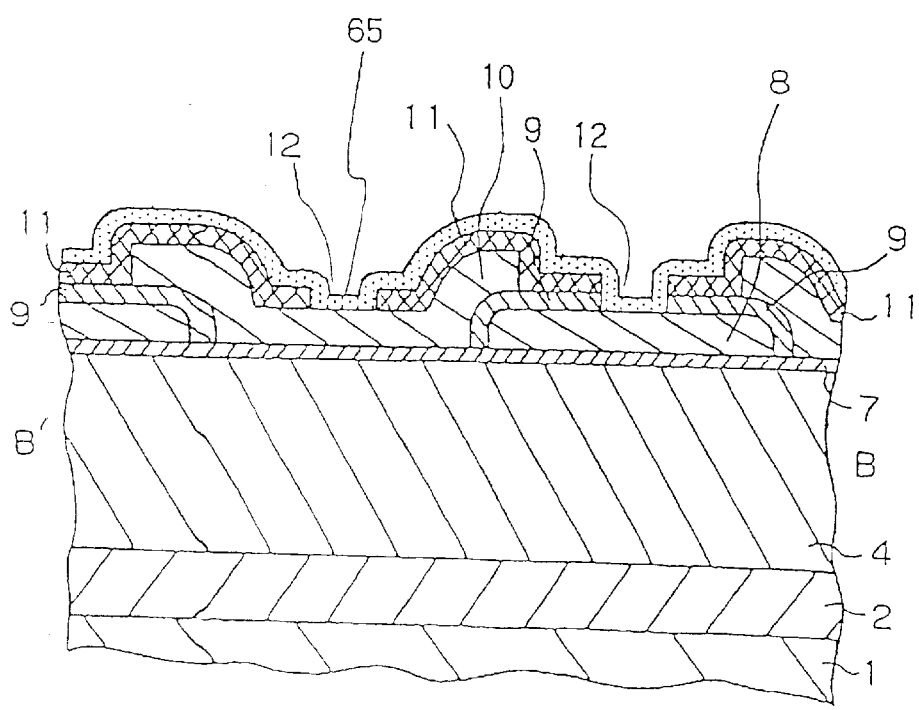

Regarding the method of manufacturing the semiconductor device of this embodiment, fabrication processes are equivalent to those of the first embodiment up to the formation of contacts 12, at which point barrier metal layer 65 is formed by depositing titanium silicide having a film thickness on the order of 300~1000 Å on oxide film 11 and contacts 12 by sputtering or by a CVD (Chemical Vapor Deposition) method. FIGS. 21a and 21b are schematic sectional views at the time of completion of these processes. Subsequent processes for forming shield film 13 are equivalent to those used in the semiconductor device of the first or second embodiment.

This embodiment allows a simplification of the manufacturing process because there is no need for a heat treatment to react the polysilicon with the metal.

Seventh Embodiment

Explanation is next presented regarding a semiconductor device according to the seventh embodiment of the present invention with reference to FIGS. 22a and 22b, and FIGS. 23a and 23b.

Figure 17A:
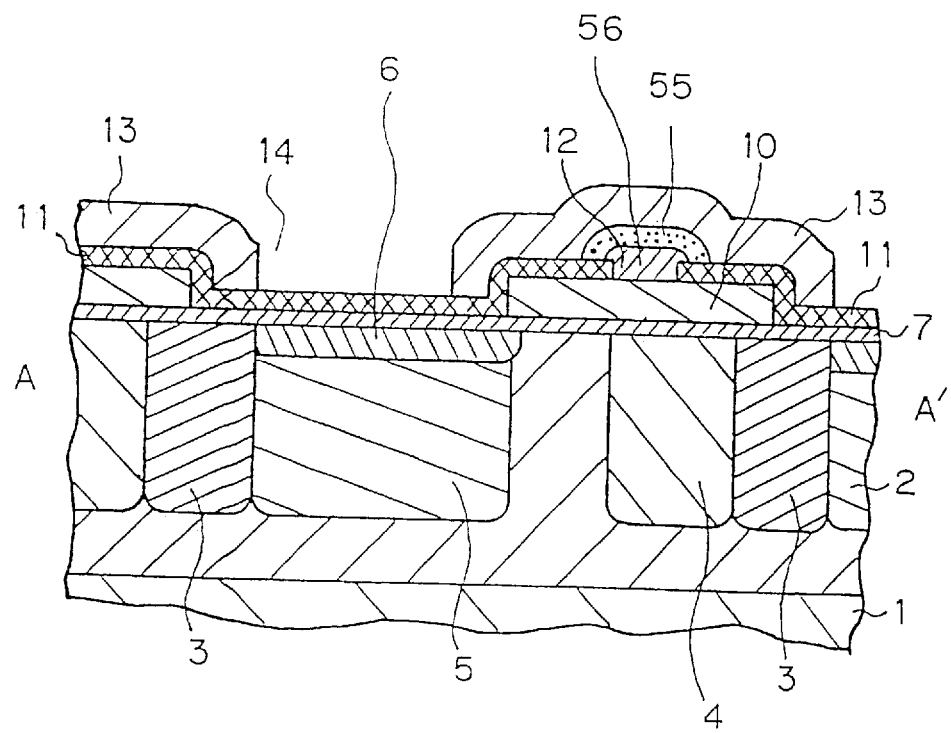
FIG. 17a is a schematic sectional view of FIG. 6 taken at line A–A'.
Figure 17B:
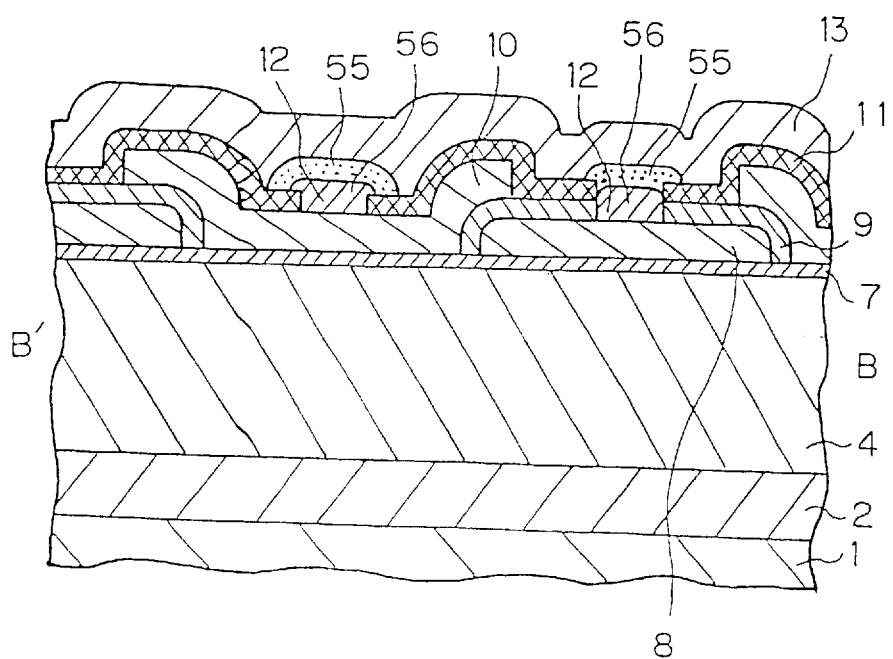
FIG. 17b is a schematic sectional view taken at line B–B' of the semiconductor device of the fifth embodiment of the present invention.

In this embodiment, the polysilicon layer that is mounded up in a hemispherical form of the fifth embodiment shown in FIGS. 17a and 17b is applied to a MOS transistor.

In an ordinary MOS transistor, the gate electrode is formed at near the limit of processing accuracy of lithography and forming contacts over the electrode is therefore difficult, but in cases in which the gate electrode is lengthened by, for example, a peripheral circuit or power transistor, contacts can be formed over an active gate.

Figure 22A:
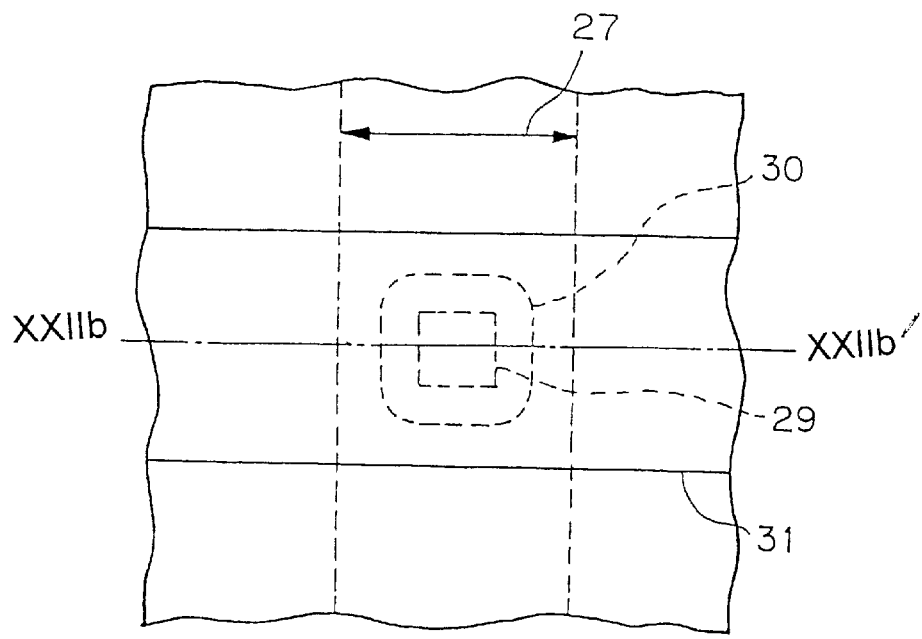
FIG. 22a is a plan view of the semiconductor device of the seventh embodiment of the present invention.
Figure 22B:
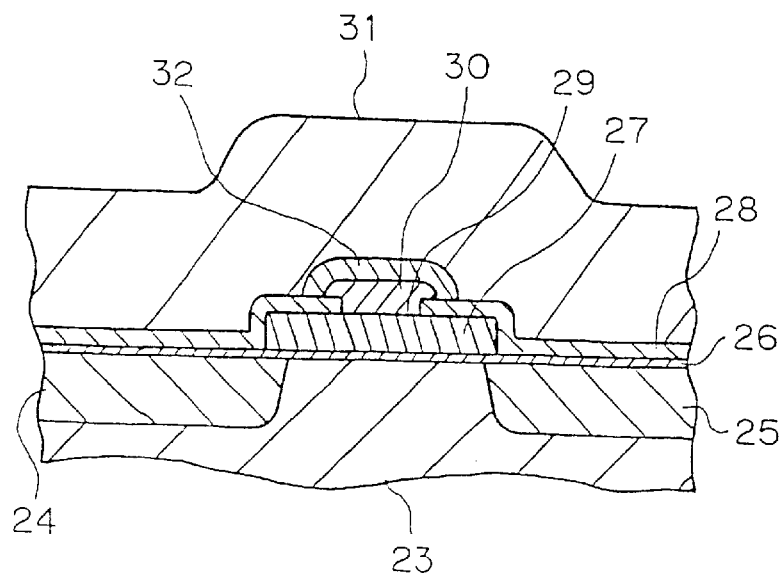
FIG. 22b is a schematic sectional view of FIG. 22a taken at line XXIIb–XXIIb'.

Explanation is next presented with reference to FIGS. 22a and 22b regarding a case in which a hemispherical polysilicon layer is applied in this type of MOS transistor.

FIG. 22b is a schematic sectional view showing the XXIIb–XXIIb' plane of FIG. 22a.

The semiconductor device of this embodiment is constructed from: drain region 24 and source region 25 formed on the surface of semiconductor substrate 23; gate insulation film 26 formed on semiconductor substrate 23; gate electrode 27 made up of silicon formed on gate film 26; insulation film 28 formed so as to cover gate electrode 27 and having contacts 29 on gate electrode 27; polysilicon layer 30 made up of polysilicon formed in a hemispherical form on gate electrode 27 that is exposed inside contacts 29; barrier film 32 composed of titanium silicide formed on polysilicon layer 30; and metal wiring 31 formed on insulation film 28 and barrier film 32.

This embodiment can increase the distance between gate film 26 and barrier film 32 without increasing the film thickness of gate electrode 27 or insulation film 28 by sandwiching polysilicon 30 between gate film 26 and barrier film 32. As a result, the influence of barrier film 32 or metal wiring 31 upon gate film 26 can be reduced.

Thus, gate drawer resistance can be lowered and high frequency operation characteristics improved, particularly in the case of wide gate width. A case in which gate electrode 27 is of minute dimensions is next described with reference to FIGS. 23a and 23b.

Figure 23A:
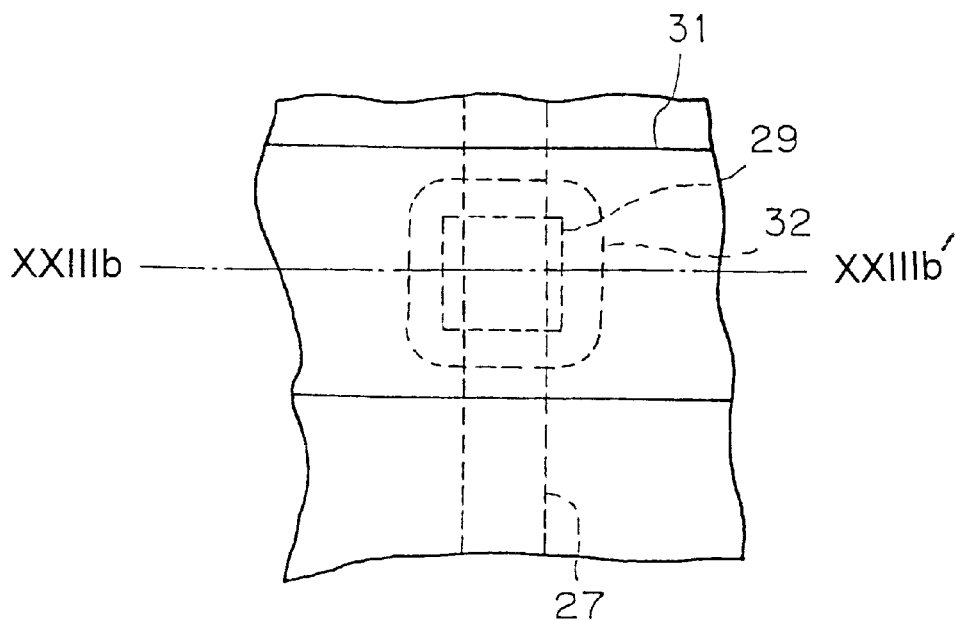
FIG. 23a is a plan view of the semiconductor device of the seventh embodiment of the present invention.
Figure 23B:
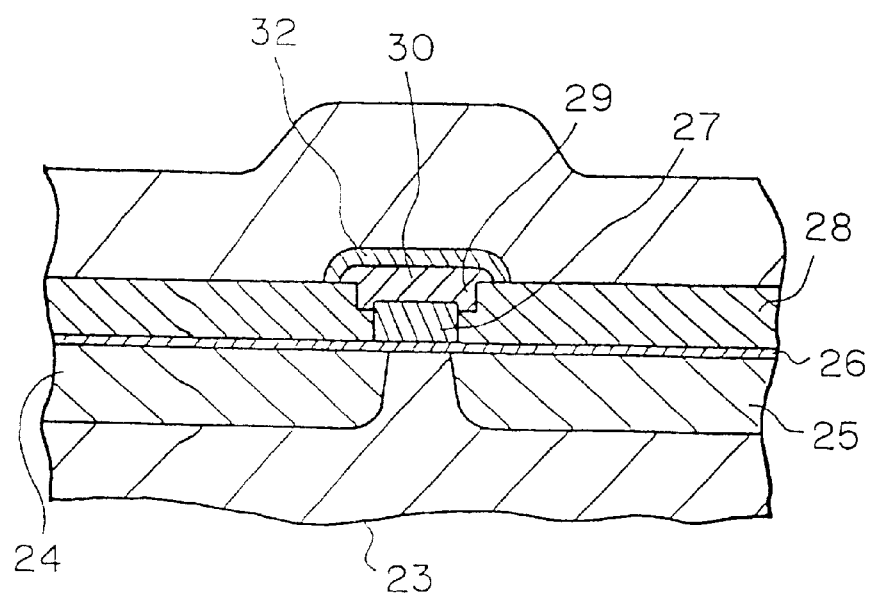
FIG. 23b is a schematic sectional view of FIG. 23a taken at line XXIIIb–XXIIIb'.

FIG. 23b is a schematic sectional view of the XXIIIb–XXIIIb' plane of FIG. 23a. Constituent elements that are equivalent to elements in FIGS. 22a and 22b are identified by the same reference numerals. As shown in FIG. 23b, gate electrode 27 is exposed by slightly over-etching when etching contact 29 in this embodiment. By employing this method, contact 29 can be provided even if gate electrode 27 is far shorter than contact 29. As a result, a contact can be provided even on an active gate of minute dimensions, thereby eliminating constraints on circuit design and enabling higher integration of a semiconductor device.

The seventh embodiment involves the application of the device that is applied in a solid-state image-sensing device in the fifth embodiment to a MOS transistor. The methods of the first to fourth embodiments may be similarly applied in the seventh embodiment.

In the above-described first to fifth embodiments, explanation was presented regarding a solid-state image-sensing device, but a similar effect can be obtained when applied to other semiconductor devices that establish contact between a conductive film and a polysilicon or single-crystal silicon.

In the above-described first to sixth embodiments, explanation was presented regarding cases in which the electrode was formed from polysilicon, but similar effects can be obtained in applications in which the electrode is a single-crystal silicon.

In the above-described first to sixth embodiments, explanation was presented regarding cases in which the barrier metal layer was formed from titanium silicide, but similar effects can be obtained in cases of using a metal silicide of other metals such as cobalt, platinum, tungsten, and molybdenum.

In the above-described first to fifth embodiments, charge transfer electrodes 8 and charge transfer electrodes 10 were formed as two separate layers, but the invention can also be applied to cases in which these charge transfer electrodes are formed from a single polysilicon layer.

Finally, in the above-described first to fifth embodiments, the barrier metal layer was formed by conversion to silicide brought about by reaction between metal and silicon, but, as in the sixth embodiment, the barrier metal layer may also be formed by a method such as sputtering or a CVD of a metal silicide that has been converted to silicide beforehand.

While preferred embodiments of the present invention have been described using specific terms, such description is for illustrative purposes only, and it is to be understood that changes and variations may be made without departing from the spirit or scope of the following claims.

What is claimed is:

1. A semiconductor device comprising:
   a first insulation film formed on a semiconductor substrate;
   a silicon electrode formed on said first insulation film and made up of polysilicon or single-crystal silicon;
   a second insulation film covering said silicon electrode except at an opening over said silicon electrode, said second insulation film contacting vertical sides of said silicon electrode and substantially all of a horizontal top surface of said silicon electrode except the opening;
   a barrier metal layer formed within a surface region of said silicon electrode that is exposed in said opening so that an upper surface of said barrier metal layer is essentially co-planar with an adjacent upper surface of said silicon electrode, and said barrier metal layer being made up of a metal silicide;
   a titanium film that is formed on said second insulation film;
   a titanium nitride film that is formed on said opening and on said titanium film and contacting said barrier metal layer; and
   a conductive film formed on said titanium nitride film.

2. A semiconductor device according to claim 1 wherein said conductive film is a single layer or multiple layers of a metal film.

3. A semiconductor device according to claim 1 wherein said conductive film is formed from a single layer or multiple layers of a material having conductivity.

4. A semiconductor device according to claim 1 wherein said conductive film is tungsten, aluminum, aluminum alloy or tungsten alloy.

5. A semiconductor device comprising:
   a first insulation film formed on a semiconductor substrate;
   a silicon electrode formed on said first insulation film and made up of polysilicon or single-crystal silicon;
   a second insulation film covering and contacting said silicon electrode except at an opening over said silicon electrode;
   a silicon layer in local contact with and over said silicon electrode at said opening, and made up of polysilicon or single-crystal silicon;
   a barrier metal layer contacting on the surface of said silicon layer, said barrier metal layer being composed of a metal silicide and having perimeter edges associated with and extending beyond perimeter edges of said silicon layer; and
   a conductive film formed on said barrier metal layer and said second insulation film.

6. A semiconductor device according to claim 5 wherein said silicon layer or said barrier metal layer has a hemispherical form over said second insulation film.

7. A semiconductor device according to claim 5 wherein said conductive film is a single layer or multiple layers of a metal film.

8. A semiconductor device according to claim 5 wherein said conductive film is formed from a single layer or multiple layers of a material having conductivity.

9. A semiconductor device according to claim 5 wherein said conductive film is tungsten, aluminum, aluminum alloy or tungsten alloy.

* * * * *